United States Patent
Kim et al.

(10) Patent No.: US 8,194,439 B2
(45) Date of Patent: Jun. 5, 2012

(54) MAGNETIC RANDOM ACCESS MEMORIES AND METHODS OF OPERATING THE SAME

(75) Inventors: Kwang-seok Kim, Seongnam-si (KR); Hyung-soon Shin, Seoul (KR); Seung-jun Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/923,376

(22) Filed: Sep. 17, 2010

(65) Prior Publication Data
US 2011/0157971 A1 Jun. 30, 2011

(30) Foreign Application Priority Data
Dec. 30, 2009 (KR) .................. 10-2009-0134923

(51) Int. Cl.
*G11C 11/00* (2006.01)

(52) U.S. Cl. ............ 365/158; 365/171; 365/189.07

(58) Field of Classification Search .......... 365/148, 365/158, 171, 189.07, 189.14, 210.1
See application file for complete search history.

(56) References Cited

U.S. PATENT DOCUMENTS

| | | | |
|---|---|---|---|
| 6,111,783 A | 8/2000 | Tran et al. | |
| 6,693,826 B1 | 2/2004 | Black, Jr. et al. | |
| 7,345,912 B2 | 3/2008 | Luo et al. | |
| 7,362,644 B2 | 4/2008 | Yang et al. | |
| 7,499,314 B2 | 3/2009 | Yang et al. | |
| 7,742,329 B2 * | 6/2010 | Yoon et al. | 365/158 |
| 7,961,509 B2 * | 6/2011 | Zhu et al. | 365/171 |
| 8,004,880 B2 * | 8/2011 | Yoon et al. | 365/158 |
| 2007/0140033 A1 | 6/2007 | Yang et al. | |
| 2007/0279968 A1 | 12/2007 | Luo et al. | |
| 2008/0094884 A1 | 4/2008 | Yang et al. | |
| 2009/0323402 A1 * | 12/2009 | Li et al. | 365/158 |
| 2010/0195376 A1 * | 8/2010 | Yoon et al. | 365/158 |

FOREIGN PATENT DOCUMENTS

| | | |
|---|---|---|
| JP | 2004-280892 | 10/2004 |
| JP | 2007-141440 | 6/2007 |
| JP | 2007-172819 | 7/2007 |
| KR | 10-2005-0068806 | 7/2005 |
| KR | 10-2009-0029751 | 3/2009 |

* cited by examiner

*Primary Examiner* — Gene Auduong
(74) *Attorney, Agent, or Firm* — Harness, Dickey & Pierce, P.L.C.

(57) ABSTRACT

A spin transfer torque magnetic random access memory (STT-MRAM) and includes: a memory cell and a reference cell configured to operate as a reference when data stored in the memory cell is read. The memory cell includes: a first magnetic tunneling junction (MTJ) element and a first transistor connected to the first MTJ element. The reference cell includes: second and third MTJ elements connected in parallel; and second and third transistors that are connected to the second and third MTJ elements, respectively. The STT-MRAM further includes a control circuit having a write circuit configured to supply write currents having opposite directions to the second and third MTJ elements.

31 Claims, 20 Drawing Sheets

MAGNETIC RANDOM ACCESS MEMORIES AND METHODS OF OPERATING THE SAME

CROSS-REFERENCE TO RELATED APPLICATION(S)

This application claim's priority under 35 U.S.C. §119 to Korean Patent Application No. 10-2009-0134923, filed on Dec. 30, 2009, in the Korean Intellectual Property Office, the entire contents of which is incorporated herein by reference.

BACKGROUND

1. Field

Example embodiments relate to magnetic memories and methods of operating the magnetic memories, for example, spin transfer torque magnetic random access memories (STT-MRAMs) and methods of operating STT-MRAMs.

2. Description of the Related Art

Magnetic random access memories (MRAMs) are memory devices for storing data by using variations in resistance of a magnetic tunneling junction (MTJ) element of a memory cell. Resistance of a MTJ element varies according to a magnetization direction of a free layer. For example, when the magnetization direction of the free layer is the same as a magnetization direction of a fixed layer, the MTJ element has a relatively low resistance. When the magnetization direction of the free layer is opposite to the magnetization direction of the fixed layer, the MTJ element has a relatively high resistance. A case where the MTJ element has a relatively low resistance may correspond to data '0', whereas a case in which the MTJ element has a relatively high resistance may correspond to data '1'. In order to read data stored in a memory cell of the MRAM, there is a need for a reference cell that is used as a reference (basis) of resistance.

An MRAM (hereinafter, referred to as a general MRAM) records data in a MTJ element using a digit line. In a general MRAM, a magnetization direction of a free layer is reversed using a magnetic field generated by the digit line spaced apart from the MTJ element by supplying a current (e.g., a write current) to the digit line. A read current is supplied between ends of the MTJ element. As such, in a general MRAM, the write current need not be considered in configuring the reference cell because paths of the read current and the write current are different from each other.

Unlike general MRAMS, STT-MRAMs do not use digit lines. In conventional STT-MRAMs, a reference cell circuit having a structure different from that of a general MRAM is required because the paths of the read current and the write current are the same.

SUMMARY

At least some example embodiments provide spin transfer torque magnetic random access memories (STT-MRAMs) including a reference cell as a reference when reading data stored in a memory cell.

At least some example embodiments also provide methods of operating STT-MRAMs.

Additional aspects will be set forth in the description which follows and may be apparent from the description, or may be learned by practice of example embodiments.

At least one example embodiment provides a spin transfer torque magnetic random access memory (STT-MRAM) including: a memory cell; a reference cell; and a control circuit. The memory cell includes a first magnetic tunneling junction (MTJ) element and a first transistor connected to the first MTJ element. The reference cell is configured as a reference when reading data stored in the memory cell. The reference cell includes: second and third MTJ elements connected in parallel; and second and third transistors that are connected to the second and third MTJ elements, respectively. The control circuit is configured to supply write currents having opposite directions to the second and third MTJ elements.

According to at least some example embodiments, one of the second and third MTJ elements may have a relatively low resistance corresponding to first data of the first MTJ element, whereas the other of the second and third MTJ elements may have a relatively high resistance corresponding to second data of the first MTJ element.

The control circuit may include a write circuit. The write circuit may be connected to the memory cell and may include: a write current source; first and second write transistors connected in parallel with the write current source; a third write transistor connected to the second write transistor; and a fourth write transistor connected to the first write transistor. The first and fourth write transistors may be connected to ends of the second and third MTJ elements. The second and third write transistors may be connected to ends of the second and third transistors. The third and fourth write transistors may be grounded.

The first and fourth write transistors may be connected to an end of the first MTJ element, whereas the second and third write transistors may be connected to an end of the first transistor.

The STT-MRAM may further include: a first selection transistor connected between the write circuit and the memory cell; and a second selection transistor connected between the write circuit and the reference cell.

The control circuit may include a read circuit. The read circuit may be configured to supply first and second read currents to the memory cell and the reference cell, respectively. A magnitude of the second read current may be about two times that of the first read current.

The read circuit may include: a first read current source connected to the memory cell; a first read transistor connected between the memory cell and the first read current source; a second read current source connected to the reference cell; a second read transistor connected between the reference cell and the second read current source; a sensing circuit to which the first and second read transistors are connected in parallel; and a third read transistor having a first end connected to the first through third transistors, and a second end that is grounded.

According to at least some example embodiments, the STT-MRAM may further include: a memory cell area having a plurality of the memory cells; and a reference cell area having a plurality of the reference cells. The control circuit may be disposed between the memory cell area and the reference cell area.

The memory cell area may further include: a plurality of first word lines; a plurality of first bit lines that intersect the plurality of first word lines; a memory cell disposed at each intersection between the plurality of first word lines and the plurality of first bit lines; and a first source line disposed between each pair of neighboring first word lines.

The reference cell area may include: first and second reference cell word lines disposed in parallel with the plurality of first word lines; a plurality of second bit lines that intersect the first and second reference cell word lines; a reference cell disposed at intersections between each of the plurality of second bit lines and the first and second reference cell word lines; and a second source line disposed between the first and second reference cell word lines.

The control circuit may include: at least one read/write block connected to the reference cell area and the memory cell area. The read/write block may include: a write circuit and a read circuit.

According to at least some example embodiments, the write circuit may include: a write current source; first and second write transistors connected to the write current source in parallel; a third write transistor connected to the second write transistor; and a fourth write transistor connected to the first write transistor. The first and fourth write transistors may be connected to one of the plurality of first bit lines and one of the plurality of second bit lines. The second and third write transistors may be connected to the first and second source lines, and the third and fourth write transistors may be grounded.

A first selection transistor may be disposed between one of the plurality of first bit lines and the write circuit. A second selection transistor may be disposed between one of the plurality of second bit lines and the write circuit.

The read circuit may include: a first read current source connected to one of the plurality of first bit lines; a first read transistor connected between one of the plurality of first bit lines and the first read current source; a second read current source connected to one of the plurality of second bit lines; a second read transistor connected between one of the plurality of second bit lines and the second read current source; a sensing circuit connected to the first and second read transistors in parallel; and a third read transistor having a first end connected to the first and second source lines, and a second end that is grounded.

The STT-MRAM may further include: at least one decoder connected between the memory cell area and the control circuit and/or between the reference cell area and the control circuit.

According to at least some example embodiments, the STT-MRAM may further include: first and second memory cell areas having a plurality of the memory cells; and first and second reference cell areas having a plurality of the reference cells. The first memory cell area and the first reference cell area may constitute a first cell block. The second memory cell area and the second reference cell area may constitute a second cell block. The control circuit may be disposed between the first and second cell blocks.

The control circuit may include at least one read circuit. The read circuit may read data of the second memory cell area by using the first reference cell area, and may read data of the first memory cell area by using the second reference cell area.

The first cell block may include: a plurality of first word lines; a plurality of first bit lines that intersect the plurality of first word lines; and a first source line disposed between each pair of neighboring first word lines. The second cell block may include: a plurality of second word lines; a plurality of second bit lines that intersect the plurality of second word lines; and a second source line disposed between each pair of neighboring second word lines. In this example, the read circuit may include: a sensing circuit; first and second read wires connected to the sensing circuit in parallel, and connected to bit lines of the first and second cell blocks, respectively; a first memory cell-reading current source and a first reference cell-reading current source that are connected to the first read wire in parallel; a second reference cell-reading current source and a second memory cell-reading current source that are connected to the second read wire in parallel; a first read transistor disposed between the first read wire and the first memory cell-reading current source, and between the second read wire and the second reference cell-reading current source; a second read transistor disposed between the first read wire and the first reference cell-reading current source, and between the second read wire and the second memory cell-reading current source; and a third read transistor having a first end connected to the first and second source lines, and a second end that is grounded. In addition, the write circuit may include: first and second write transistors connected to the write current source in parallel; a third write transistor connected to the second write transistor; and a fourth write transistor connected to the first write transistor. The first and fourth write transistors may be connected to one of the plurality of first bit lines and one of the plurality of second bit lines. The second and third write transistors may be connected to the first and second source lines, and the third and fourth write transistors are grounded.

The STT-MRAM may further include: a first selection transistor connected between one of the plurality of first bit lines and the write circuit; and a second selection transistor connected between one of the plurality of second bit lines and the write circuit.

The STT-MRAM may further include: at least one decoder disposed between the first cell block and the control circuit and/or between the second cell block and the control circuit.

At least one other example embodiment provides a method of operating an STT-MRAM including: a memory cell; a reference cell; and a control circuit. The memory cell includes a first magnetic tunneling junction (MTJ) element and a first transistor connected to the first MTJ element. The reference cell is configured as a reference when reading data stored in the memory cell. The reference cell includes: second and third MTJ elements connected in parallel; and second and third transistors that are connected to the second and third MTJ elements, respectively. The control circuit is configured to supply write currents having opposite directions to the second and third MTJ elements. According to at least this example embodiment, the method includes: supplying a first write current to the second MTJ element; supplying a second write current to the third MTJ element, wherein a direction of the second write current is opposite to a direction of the first write current; supplying a third write current to the memory cell; and supplying first and second read currents to the memory cell, and a reference cell, respectively. A magnitude of the second read current may be about two times that of the first read current.

According to at least some example embodiments, the control circuit may include a write circuit. The write circuit may include: a write current source; first and second write transistors connected to the write current source in parallel; a third write transistor connected to the second write transistor; a fourth write transistor connected to the first write transistor; a first selection transistor connected between an end of the first MTJ element and the first and fourth write transistors; and a second selection transistor connected between ends of the second and third MTJ elements and the first and fourth write transistors. The second and third write transistors may be connected to ends of the first through third transistors, and the third and fourth write transistors may be grounded.

The supplying of the first write current to the second MTJ element may include: turning-on the first and third write transistors, the second selection transistor, and the second transistor.

The supplying of the second write current to the third MTJ element may include: turning-on the second and fourth write transistors, the second selection transistor, and the third transistor.

The supplying of the third write current to the first MTJ element may include: turning-on the first and third write transistors, the first selection transistor, and the first transistor, or turning-on the second and fourth write transistors, the first selection transistor, and the first transistor.

According to at least some example embodiments, the control circuit may include a read circuit. The read circuit may include: a first read current source connected to the memory cell; a first read transistor connected between the memory cell and the first read current source; a second read current source connected to the reference cell; a second read transistor connected between the reference cell and the second read current source; a sensing circuit to which the first and second read transistors are connected in parallel; and a third read transistor having a first end connected to the first through third transistors, and a second end that is grounded.

The supplying of the first and second read currents may include: turning-on the first through third read transistors, and the first through third transistors.

The STT-MRAM may include: first and second memory cell areas having a plurality of the memory cells; and first and second reference cell areas having a plurality of the reference cells. The first memory cell area and the first reference cell area constitute a first cell block, and the second memory cell area and the second reference cell area constitute a second cell block. The control circuit may be disposed between the first and second cell blocks.

According to at least some example embodiments, the method may further include: supplying the first read current to a memory cell of the first memory cell area and simultaneously or concurrently supplying the second read current to a reference cell of the first reference cell area; and supplying the first read current to a memory cell of the second memory cell area and simultaneously or concurrently supplying the second read current to a reference cell of the second reference cell area.

BRIEF DESCRIPTION OF THE DRAWINGS

Example embodiments will become more apparent and readily appreciated from the following description of the accompanying drawings in which.

DETAILED DESCRIPTION

Figure 1:
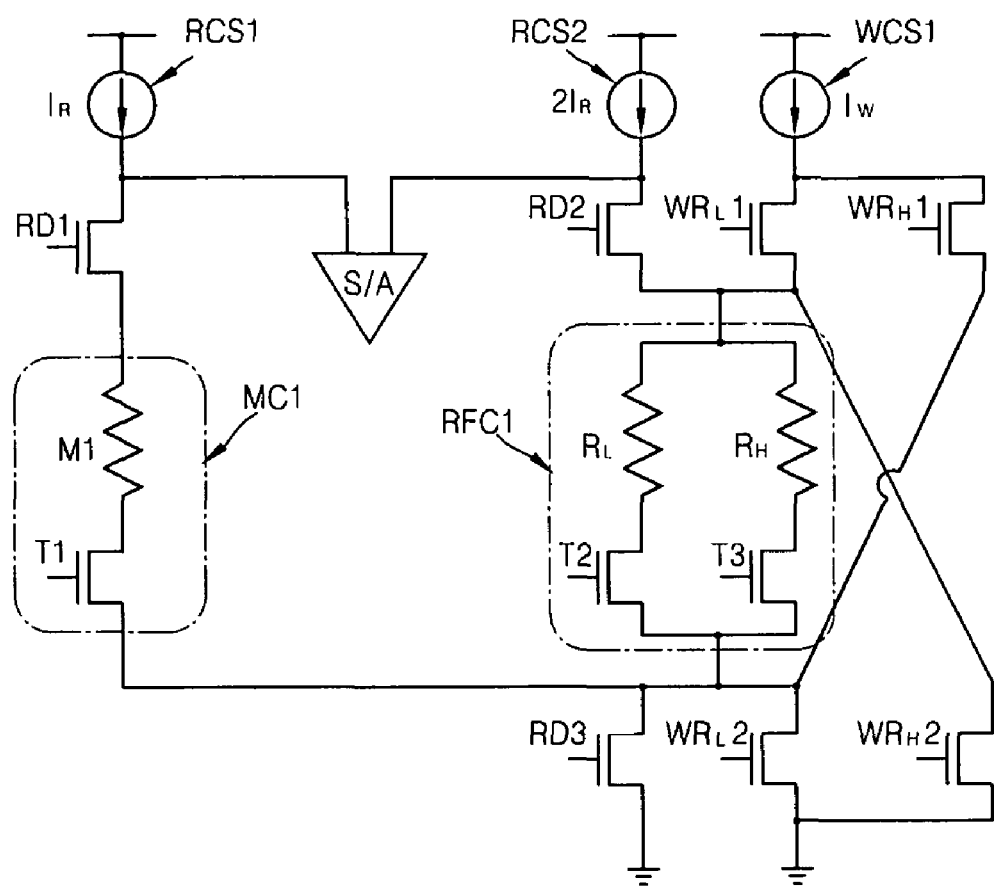
FIG. 1 is a circuit diagram of a spin transfer torque magnetic random access memory (STT-MRAM) according to an example embodiment.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

Although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the drawings, the thicknesses of layers and regions are exaggerated for clarity. Like reference numerals in the drawings denote like elements.

FIG. 1 is a circuit diagram of a spin transfer torque magnetic random access memory (STT-MRAM) according to an example embodiment.

Referring to FIG. 1, the STT-MRAM includes a memory cell MC1 and a reference cell RFC1 corresponding to the memory cell MC1. The memory cell MC1 includes a first magnetic tunneling junction (MTJ) element M1 for storing data, and a first transistor T1 connected to the first MTJ element M1. The first MTJ element M1 is also connected to a first read current source RCS1. A first read transistor RD1 is disposed between the first read current source RCS1 and the first MTJ element M1.

The reference cell RFC1 includes: second and third MTJ elements $R_L$ and $R_H$ that are connected to each other in parallel; and second and third transistors T2 and T3 that are connected to the second and third MTJ elements $R_L$ and $R_H$ in series, respectively. In this example, the second and third MTJ elements $R_L$ and $R_H$ may have different resistances. The second MTJ element $R_L$ may have a relatively low resistance (e.g., a minimum resistance) corresponding to first data of the first MTJ element M1 of the memory cell MC1, and the third MTJ element $R_H$ may have a relatively high resistance (e.g., a maximum resistance) corresponding to second data of the first MTJ element M1. The reference cell RFC1 is connected to a second read current source RCS2. A second read transistor RD2 is connected between the second read current source RCS2 and the reference cell RFC1. The second and third MTJ elements $R_L$ and $R_H$ are connected to the second read transistor RD2 in parallel. A third read transistor RD3 is connected to the second and third transistors T2 and T3. The third read transistor RD3 is also grounded. For example, the second and third transistors T2 and T3 are connected to a first end of the third read transistor RD3, whereas a second end of the third read transistor RD3 is grounded. The first end of the third read transistor RD3, which is connected to the second and third transistors T2 and T3, is connected to the first transistor T1 of the memory cell MC1.

A sensing circuit S/A is commonly connected to a wire for connecting the first read current source RCS1 and the memory cell MC1 and a wire for connecting the second read current source RCS2 and the reference cell RFC1. For example, the sensing circuit S/A is commonly connected to a wire between the first read current source RCS1 and the first read transistor RD1 and a wire between the second read current source RCS2 and the second read transistor RD2.

The STT-MRAM further includes a write current source WCS1. First and second write transistors $WR_L1$ and $WR_H1$ are connected to the write current source WCS1 in parallel. A third write transistor $WR_L2$ is connected to the second write transistor $WR_H1$, and a fourth write transistor $WR_H2$ is connected to the first write transistor $WR_L1$. An end of each of the third and fourth write transistors $WR_L2$ and $WR_H2$ is grounded. The first and fourth write transistors $WR_L1$ and $WR_H2$ are connected to an end of each of the second and third MTJ elements $R_L$ and $R_H$ of the reference cell RFC1, and the second and third write transistors $WR_H1$ and $WR_L2$ are connected to an end of a side of the second and third transistors T2 and T3 of the reference cell RFC1. For example, the first and fourth write transistors $WR_L1$ and $WR_H2$ are commonly connected to an end (an upper end of FIG. 1) of the second and third MTJ elements $R_L$ and $R_H$, whereas the second and third write transistors $WR_H1$ and $WR_L2$ are commonly connected to an end (a lower end of FIG. 1) of the second and third transistors T2 and T3. Thus, the write current source WCS1 is connected to the reference cell RFC1 via the first through fourth write transistors $WR_L1$, $WR_H1$, $WR_L2$ and $WR_H2$.

A given, desired or predetermined write current is supplied to the reference cell RFC1 by using the write current source WCS1 and the first through fourth write transistors $WR_L1$, $WR_H1$, $WR_L2$ and $WR_H2$. Although not illustrated in FIG. 1, the write current source WCS1 may also be connected to the memory cell MC1 via at least some of the first through fourth write transistors $WR_L1$, $WR_H1$, $WR_L2$ and $WR_H2$. For example, at least some of the first through fourth write transistors $WR_L1$, $WR_H1$, $WR_L2$ and $WR_H2$ may also be connected to the memory cell MC1. In this case, a write current may also be supplied to the memory cell MC1 by using the write current source WCS1.

Figure 2:
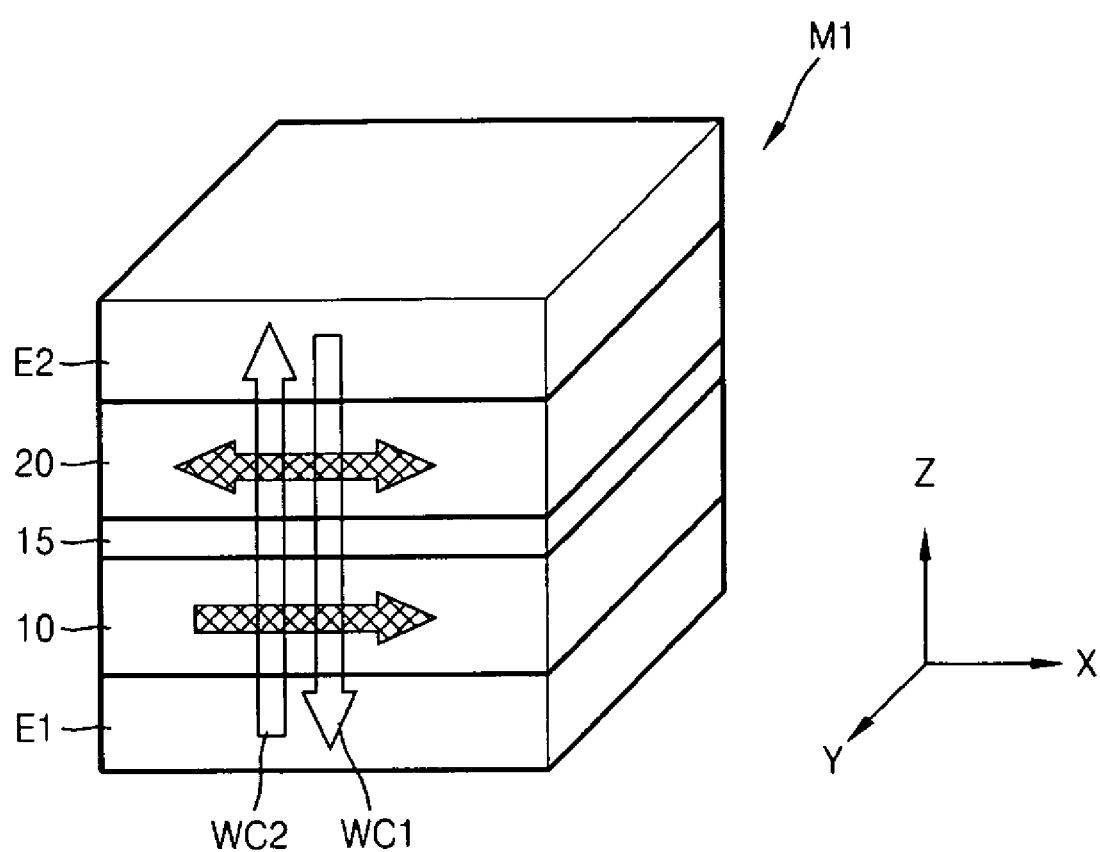
FIG. 2 is a perspective view of a first magnetic tunneling junction (MTJ) element of FIG. 1 according to an example embodiment.

FIG. 2 is a perspective view of the first MTJ element M1 of FIG. 1 according to an example embodiment.

Referring to FIG. 2, the first MTJ element M1 includes: a fixed layer 10; a free layer 20; and a tunnel layer 15 disposed between the fixed layer 10 and the free layer 20. A magnetization direction of the fixed layer 10 may be fixed in, for example, an X-axis direction. A magnetization direction of the free layer 20 may be the X-axis direction or a direction opposite thereto according to magnetization conditions. The first MTJ element M1 further includes: a first electrode E1 that contacts the fixed layer 10; and a second electrode E2 that contacts the free layer 20. In the example shown in FIG. 2, the fixed layer 10, the tunnel layer 15, the free layer 20 and the second electrode E2 are sequentially disposed on the first electrode E1.

Although not illustrated in FIG. 2, an element for fixing a magnetization direction of the fixed layer 10 (e.g., an antiferromagnetic layer) may be disposed between the first electrode E1 and the fixed layer 10. The first and second electrodes E1 and E2 may be formed as wires. In this case, the first and second electrodes E1 and E2 may be disposed parallel, substantially parallel, perpendicular or substantially perpendicular to each other.

First and second write currents WC1 and WC2 may be supplied between the first and second electrodes E1 and E2. The magnetization direction of the free layer 20 may vary according to directions of the first and second write currents WC1 and WC2. For example, when the first write current WC1 is supplied from the second electrode E2 to the first electrode E1, the free layer 20 may be magnetized in the same direction as that of the fixed layer 10.

In more detail, electrons are moved from the first electrode E1 to the second electrode E2 by the first write current WC1. In this case, electrons having the same spin direction as that of the fixed layer 10 apply torque to the free layer 20. Thus, the free layer 20 is magnetized in the same direction as that of the fixed layer 10. When the second write current WC2 is supplied from the first electrode E1 to the second electrode E2, the free layer 20 is magnetized in a direction opposite direction to that of the fixed layer 10. This is at least because electrons having a spin direction opposite to that of the fixed layer 10 are moved back to the free layer 20 to apply torque to the free layer 20 when electrons flow from the second electrode E2 to the first electrode E1 by the second write current WC2. As such, a magnetization direction of the free layer 20 in the first MTJ element M1 varies according to spin transfer torque. When the magnetization direction of the free layer 20 is the same as that of the fixed layer 10, the first MTJ element M1 has a relatively low resistance. When the magnetization direction of the free layer 20 is opposite to that of the fixed layer 10, the first MTJ element M1 has a relatively high resistance. A case where the first MTJ element M1 has the relatively low resistance may correspond to data '0', and a case where the first MTJ element M1 has the relatively high resistance may correspond to data '1'. Thus, the first MTJ element M1 may be an STT-MTJ element in which data is recorded by spin transfer torque (STT).

A read current (not shown) may be supplied between the first and second electrodes E1 and E2. Data recorded in the first MTJ element M1 may be read by supplying the read current between the first and second electrodes E1 and E2. In this case, the magnetization direction of the free layer 20 is not changed by the read current because an intensity of the read current is much smaller than an intensity of each of the first and second write currents WC1 and WC2.

In a memory cell of an STT-MRAM according to an example embodiment, a path of a write current may be the same as a path of a read current. On the other hand, in a case of a general magnetic random access memory (MRAM) using a digit line, the digit line is installed spaced apart from an MTJ element, a current is applied to the digit line and then a magnetization direction of a free layer is reversed by a magnetic field generated by the current. A read current is supplied between two ends of the MTJ element. Thus, writing method of a general MRAM is completely different from that of the STT-MRAM according to at least this example embodiment. In a general MRAM, the write current is not considered when configuring a reference cell because a path of a read current is different from a path of a write current. However, in a memory cell of an STT-MRAM according to at least this example embodiment, a circuit of the reference cell needs to be configured in consideration of the write current in addition to the read current because the path of the write current is the same as the path of the read current.

A structure of the second and third MTJ elements $R_L$ and $R_H$ of FIG. 1 may be the same or substantially the same as that of the first MTJ element M1 of FIG. 2. In the second MTJ element $R_L$, the magnetization direction of the fixed layer 10 may be the same as that of the free layer 20. In the third MTJ element $R_H$, the magnetization direction of the fixed layer 10 may be opposite to that of the free layer 20.

Figure 3A:
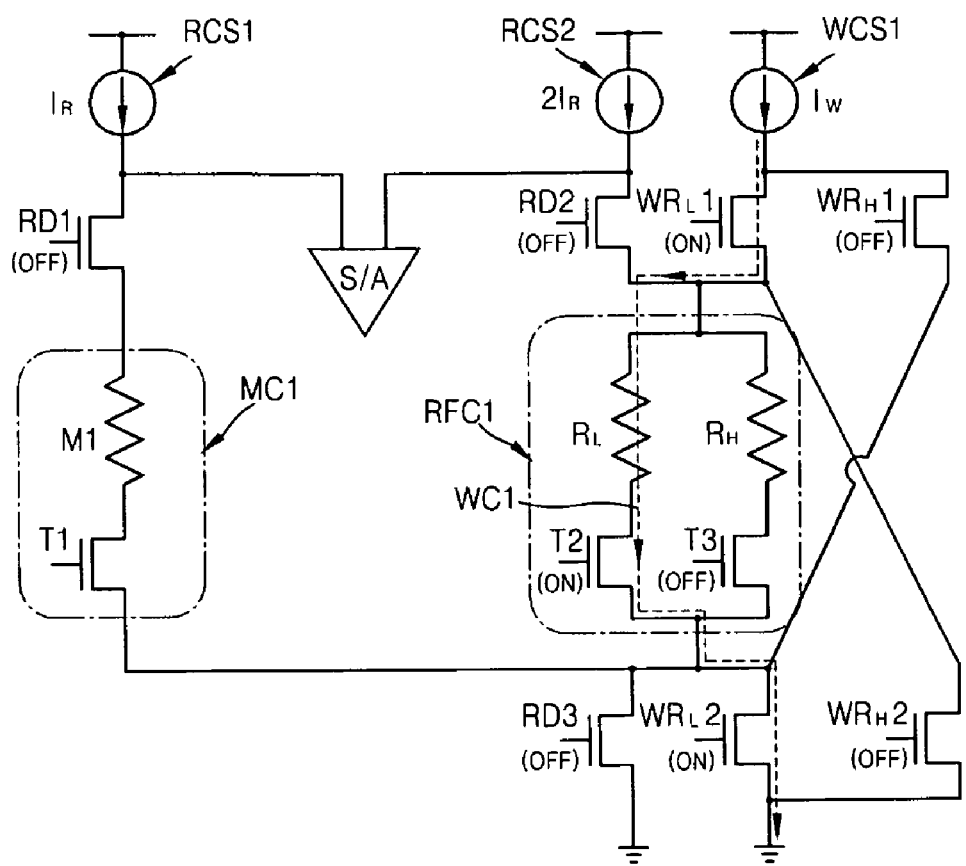
FIGS. 3A through 3C are circuit diagrams for explaining a method of operating an STT-MRAM according to an example embodiment.
Figure 3B:
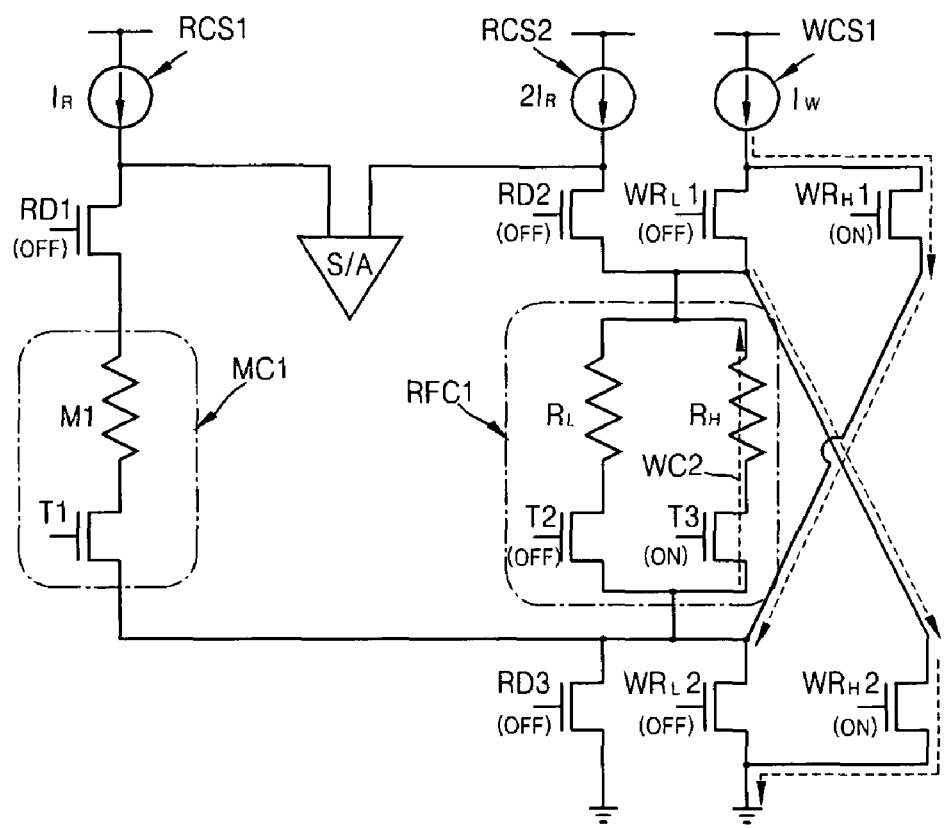
Figure 3C:
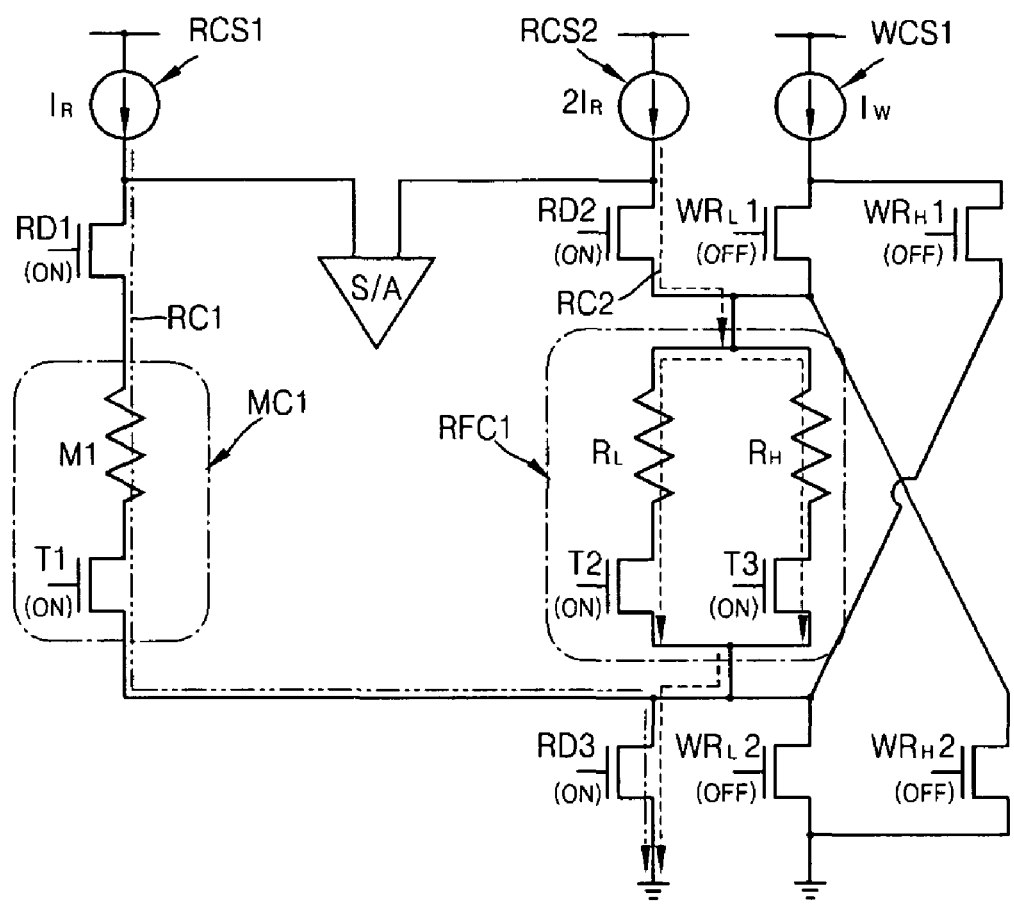

FIGS. 3A through 3C are circuit diagrams for explaining an example embodiment of a method of operating the STT-MRAM of FIG. 1. FIGS. 3A and 3B show an example embodiment of a method of supplying the first and second write currents WC1 and WC2 to the reference cell RFC1. In addition, FIG. 3C shows an example embodiment of a method of reading data stored in the memory cell MC1.

Referring to FIG. 3A, logic '0' is input to the first through third read transistors RD1, RD2 and RD3, the second and fourth write transistors $WR_H1$ and $WR_H2$, and the third transistor T3, whereas logic '1' is input to the first and third write transistors $WR_L1$ and $WR_L2$, and the second transistor T2. As discussed herein, a transistor is turned-off by inputting logic '0' to the transistor, but turned-on by inputting logic '1' to the transistor. As described above, when logic '0' and logic '1' are input, the first write current WC1 flows from the write current source WCS1 to a ground via the first write transistor $WR_L1$, the second MTJ element $R_L$, the second transistor T2, and the third write transistor $WR_L2$. The first write current WC1 corresponds to the first write current WC1 of FIG. 2. Thus, in the second MTJ element $R_L$, a free layer is magnetized in the same magnetization direction as that of a fixed layer, and the second MTJ element $R_L$ may have a relatively low resistance. Accordingly, the second MTJ element $R_L$ is a relatively low resistance MTJ element.

Referring to FIG. 3B, logic '0' is input to the first through third read transistors RD1, RD2 and RD3, the first and third write transistors $WR_L1$ and $WR_L2$, and the second transistor T2, whereas logic '1' is input to the second and fourth write transistors $WR_H1$ and $WR_H2$, and the third transistor T3. In this case, the second write current WC2 flows from the write current source WCS1 to ground via the second write transistor $WR_H1$, the third transistor T3, the third MTJ element $R_H$, and the fourth write transistor $WR_H2$. The second write current WC2 may correspond to the second write current WC2 of FIG. 2. Thus, in third MTJ element $R_H$, a free layer is magnetized in a magnetization direction opposite to that of a fixed layer, and the third MTJ element $R_H$ has a relatively high resistance. Accordingly, the third MTJ element $R_H$ is a relatively high resistance MTJ element.

As described with reference to FIGS. 3A and 3B, the second and third MTJ elements $R_L$ and $R_H$ of the reference cell RFC1 may be operated to have a relatively low resistance and a relatively high resistance by using the first and second write currents WC1 and WC2, respectively. Such an operation may be performed once (e.g., only once) prior to performing a normal reading operation on the memory cell MC1. For example, the second and third MTJ elements $R_L$ and $R_H$ are configured so as to have desired resistances in an initial stage, and then a reading operation may be performed on the memory cell MC1 by using the reference cell RFC1 including the second and third MTJ elements $R_L$ and $R_H$.

FIG. 3C shows an example embodiment of a method of reading data stored in the memory cell MC1.

Referring to FIG. 3C, logic '1' is input to the first through third read transistors RD1, RD2 and RD3, and the first through third transistors T1, T2 and T3, whereas logic '0' is input to the first through fourth write transistors $WR_L1$, $WR_H1$, $WR_L2$ and $WR_H2$. Thus, a first read current RC1 flows from the first read current source RCS1 to ground via the first read transistor RD1, the memory cell MC1 and the third read transistor RD3. In addition, a second read current RC2 flows from the second read current source RCS2 to the ground via the second read transistor RD2, the reference cell RFC1 and the third read transistor RD3. An intensity (magnitude) $2I_R$ of the second read current RC2 is about twice as high as an intensity (magnitude) $I_R$ of the first read current RC1. Because the second and third MTJ elements $R_L$ and $R_H$ of the reference cell RFC1 are connected to each other in parallel, the second read current RC2 branches and flows to the second and third MTJ elements $R_L$ and $R_H$. Thus, a current having the intensity $I_R$ that is the same or substantially the same as that of a current (e.g., the first read current RC1) supplied to the memory cell MC1 is supplied to each of the second and third MTJ elements $R_L$ and $R_H$.

Figure 4:
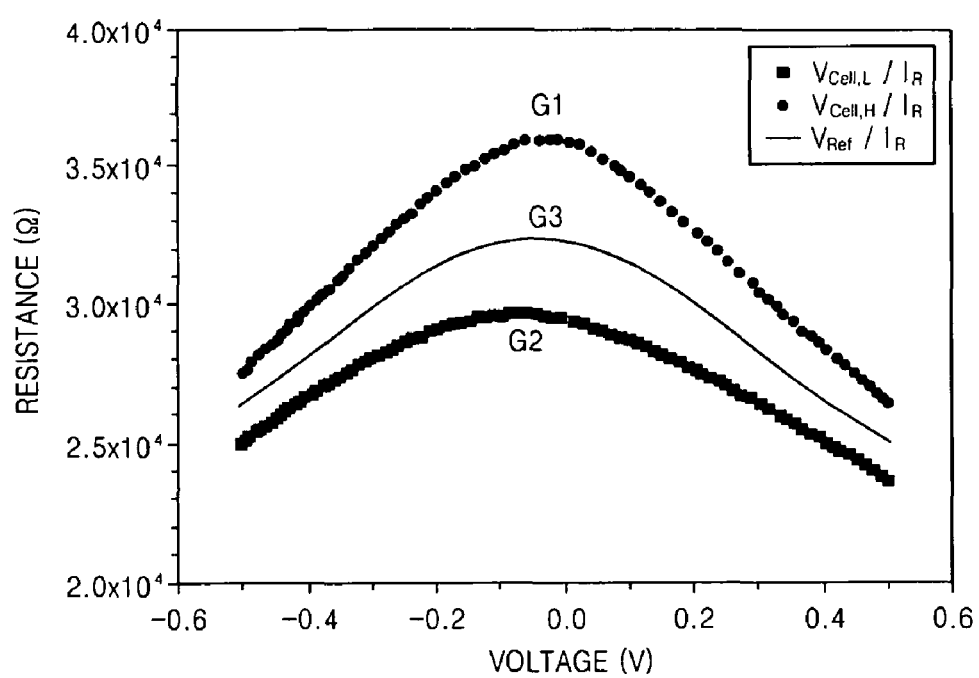
FIG. 4 is a graph showing example voltage-resistance characteristics of MTJ elements included in a memory cell and a reference cell of a STT-MRAM according to an example embodiment.

The sensing circuit S/A senses and amplifies a difference between the resistance (hereinafter, referred to as the 'first resistance') of the memory cell MC1 due to the first read current RC1 and the resistance (hereinafter, referred to as the 'second resistance') of the reference cell RFC1 due to the second read current RC2, to identify data stored in the memory cell MC1. According to at least this example embodiment, because the second MTJ element $R_L$ has a relatively low resistance RL of the first MTJ element M1, and the third MTJ element $R_H$ has a relatively high resistance RH of the first MTJ element M1, the second resistance has a value that is roughly an intermediate value [(RH+RL)/2] between the relatively low resistance RL and the relatively high resistance RH. Thus, a sensing margin may be ensured. Accordingly, when the STT-MRAM according to at least this example embodiment is used, reliability of a reading operation may be improved. A voltage applied to the second and third MTJ elements $R_L$ and $R_H$ of the reference cell RFC1 may be similar or substantially similar to a voltage applied to the first MTJ element M1 of the memory cell MC1. Thus, even though an applied voltage varies, an equivalent resistance of the reference cell RFC1 may be maintained at the intermediate value [(RH+RL)/2] between the relatively low resistance RL and the relatively high resistance RH of the memory cell MC1. FIG. 4 shows an example of this result of the reference cell RFC1.

In FIG. 4, a first plot G1 shows a change in the relatively high resistance of the first MTJ element M1, a second plot G2 shows a change in the relatively low resistance of the first MTJ element M1, and a third plot G3 shows a change in resistance measured in the reference cell RFC1 according to an applied voltage.

As shown in FIG. 4, even though the applied voltage varies, the resistance measured in the reference cell RFC1 is maintained at about the intermediate value between the relatively high resistance and the relatively low resistance of the first MTJ element M1.

As such, even if the applied voltage varies, a voltage $V_{Ref}$ of the reference cell RFC1 is also be maintained at about an intermediate value [$(V_{Cell,H} + V_{Cell,L})/2$] between a voltage $V_{Cell,H}$ and a voltage $V_{Cell,L}$ of the memory cell MC1 because the resistance measured in the reference cell RFC1 is maintained at about the intermediate value between the relatively high resistance and the relatively low resistance of the first MTJ element M1.

Figure 5:
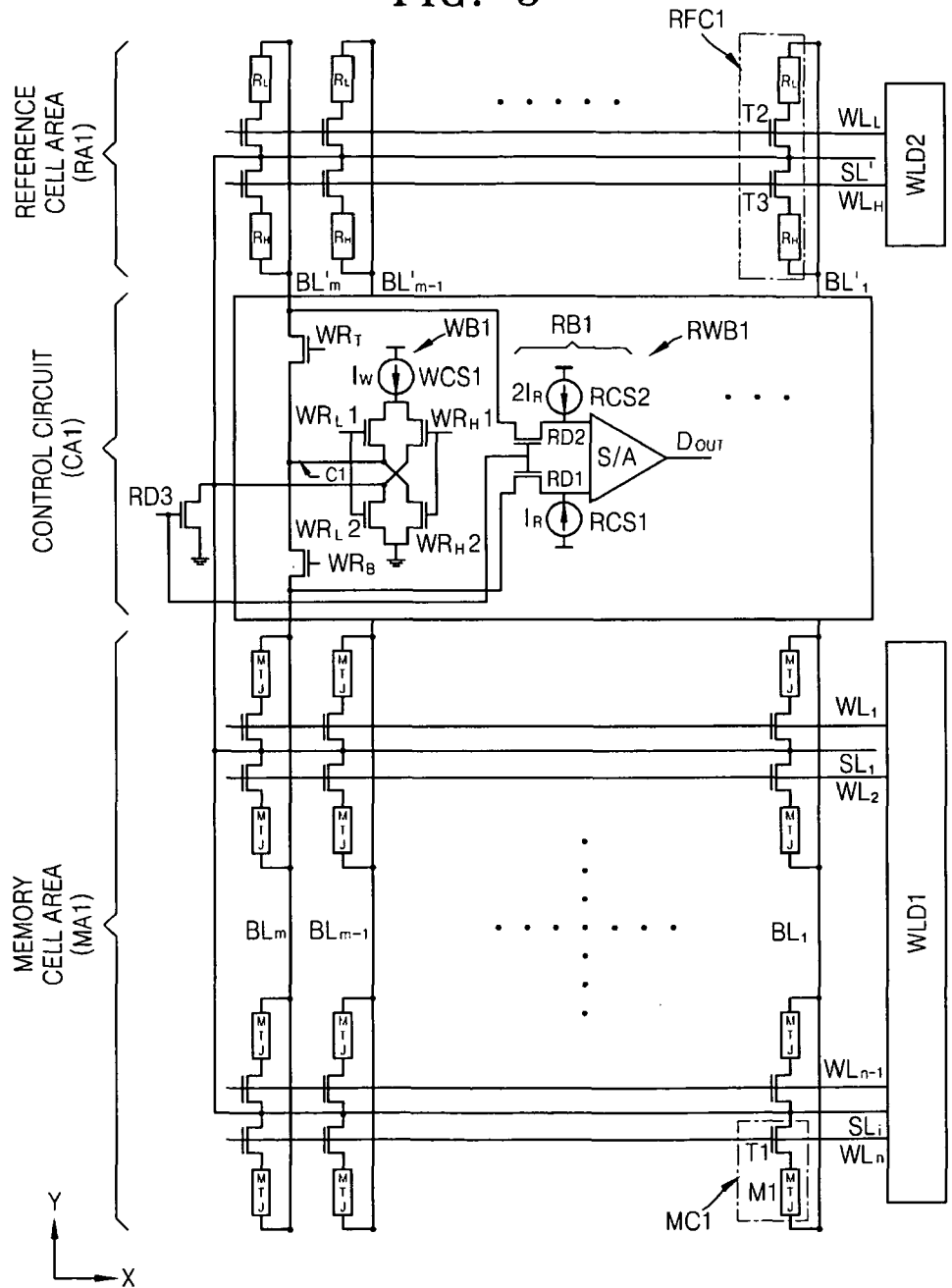
FIG. 5 is a circuit diagram of an array architecture of a STT-MRAM according to an example embodiment.

FIG. 5 is a circuit diagram of an overall array architecture of a STT-MRAM according to an example embodiment.

Referring to FIG. 5, the STT-MRAM includes a memory cell area MA1, a reference cell area RA1 and a control circuit area CA1.

In the memory cell area MA1, a plurality of word lines $WL_1$ through $WL_n$ extending in an X-axis direction are arranged at given, desired or predetermined intervals. In addition, a plurality of bit lines $BL_1$ through $BL_m$ are arranged perpendicular to the word lines $WL_1$ through $WL_n$. A plurality of the memory cells MC1 are disposed at intersections between the word lines $WL_1$ through $WL_n$ and the bit lines $BL_1$ through $BL_m$. Each memory cell MC1 includes a transistor T1 connected to one of the word lines $WL_1$ through $WL_n$ that corresponds to the memory cell MC1, and an MTJ element M1 connected between the transistor T1 and one of the bit lines $BL_1$ through $BL_m$ that corresponds to the transistor T1. The transistor T1 and the MTJ element M1 of the memory cell MC1 will be referred to as the first transistor T1 and the first MTJ element M1, respectively. A plurality of source lines $SL_1$ through $SL_i$ are arranged between each pair of neighboring word lines $WL_1$ through $WL_n$. The first transistor T1 and adjacent first transistor T1 that are connected to the neighboring word lines share one of the source lines $SL_1$ through $SL_i$ with each other. A first word line driver WLD1 is commonly connected to ends of the word lines $WL_1$ through $WL_n$.

Still referring to FIG. 5, two word lines (hereinafter, referred to as the first and second reference cell word lines) $WL_L$ and $WL_H$ extending in an X-axis direction are disposed in the reference cell area RA1. In addition, a plurality of bit lines $BL'_1$ through $BL'_m$ are arranged perpendicular to the first and second reference cell word lines $WL_L$ and $WL_H$. A reference cell RFC1 is disposed between each of the bit lines $BL'_1$ though $BL'_m$, and the reference cell word lines $WL_L$ and $WL_H$. The reference cell RFC1 includes: the second transistor T2 and the second MTJ element $R_L$ that are connected to the first reference cell word line $WL_L$; and the third transistor T3 and the third MTJ element $R_H$ that are connected to the second reference cell word line $WL_H$. The second MTJ element $R_L$ is connected between the second transistor T2 and one of the bit lines $BL'_1$ through $BL'_m$ that corresponds to the second transistor T2. The third MTJ element $R_H$ is connected between the third transistor T3 and one of the bit lines $BL'_1$ through $BL'_m$ that corresponds to the third transistor T3. The second and third transistors T2 and T3 connected to the first and second reference cell word lines $WL_L$ and $WL_H$ share a source line (hereinafter, referred to as the reference cell source line SL') with each other. A second word line driver WLD2 is commonly connected to ends of the first and second reference cell word lines $WL_L$ and $WL_H$.

The control circuit area CA1 is disposed between the memory cell area MA1 and the reference cell area RA1. The control circuit area CA1 includes at least one read/write block RWB1. The read/write block RWB1 includes a write circuit WB1 and a read circuit RB1.

The write circuit WB1 includes: a write current source WCS1 and first and second write transistors $WR_L1$ and $WR_H1$ that are connected in parallel with the write current source WCS1. The write circuit WB1 further includes: a third write transistor $WR_L2$ connected to the second write transistor $WR_H1$; and a fourth write transistor $WR_H2$ connected to the first write transistor $WR_L1$. An end of each of the third and fourth write transistors $WR_L2$ and $WR_H2$ is grounded. The first and fourth write transistors $WR_L1$ and $WR_H2$ are connected to the bit lines $BL_1$ through $BL_m$ of the memory cell area MA1 and the bit lines $BL'_1$ through $BL'_m$ of the reference cell area RA1 such that the first and fourth write transistors $WR_L1$ and $WR_H2$ are connected to the first MTJ element M1 of the memory cell area MA1, and the second and third MTJ elements $R_L$ and $R_H$ of the reference cell area RA1.

FIG. 5 illustrates an example in which the first and fourth write transistors $WR_L1$ and $WR_H2$ are connected to the leftmost bit line $BL_m$ of the bit lines $BL_1$ through $BL_m$ of the memory cell area MA1, and the leftmost bit line $BL'_m$ of the bit lines $BL'_1$ through $BL'_m$ of the reference cell area RA1. If a wire that is commonly connected to the first and fourth write transistors $WR_L1$ and $WR_H2$ is referred to as a first wire C1, the first wire C1 is connected to the bit line $BL_m$ of the bit lines $BL_1$ through $BL_m$ of the memory cell area MA1, and the bit line $BL'_m$ of the bit lines $BL'_1$ through $BL'_m$ of the reference cell area RA1. A first selection transistor $WR_B$ is disposed between the first wire C1 and the bit line $BL_m$ of the memory cell area MA1 connected to the first wire C1. A second selection transistor $WR_T$ is disposed between the first wire C1 and the bit line $BL'_m$ connected to the first wire C1. The second and third write transistors $WR_H1$ and $WR_L2$ are connected to the source lines $SL_1$ through $SL_i$ of the memory cell area MA1 and the source line SL' of the reference cell area RA1 such that the second and third write transistors $WR_H1$ and $WR_L2$ are connected to the first transistor T1 of the memory cell MC1 and the second and third transistors T2 and T3 of the reference cell area RA1.

The write current source WCS1 and the first through fourth write transistors $WR_L1$, $WR_H1$, $WR_L2$ and $WR_H2$ of FIG. 5 correspond to the write current source WCS1 and the first through fourth write transistors $WR_L1$, $WR_H1$, $WR_L2$ and $WR_H2$ of FIG. 1, respectively. The same signal may be concurrently or simultaneously applied to gate electrodes of the first and third write transistors $WR_L1$ and $WR_L2$. Similarly, the same signal may be concurrently or simultaneously applied to gate electrodes of the second and fourth write transistors $WR_H1$ and $WR_H2$. In other words, the first and third write transistors $WR_L1$ and $WR_L2$ may be synchronized, and the second and fourth write transistors $WR_H1$ and $WR_H2$ may be synchronized.

The read circuit RB1 includes: a first read current source RCS1 connected to the memory cell area MA1; and a second read current source RCS2 connected to the reference cell area RA1. A first read transistor RD1 is disposed between the first read current source RCS1 and the memory cell area MA1. A second read transistor RD2 is disposed between the second read current source RCS2 and the reference cell area RA1. FIG. 5 illustrates a case where the first read current source RCS1 is connected to the leftmost bit line $BL_m$ of the bit lines $BL_1$ through $BL_m$ of the memory cell area MA1, and the second read current source RCS2 is connected to the leftmost bit line $BL'_m$ of the bit lines $BL'_1$ through $BL'_m$ of the reference cell area RA1. The first read current source RCS1 and the second read current source RCS2 is connected to the bit lines $BL_m$ and $BL'_m$ outside the write circuit WB1. The first and second read transistors RD1 and RD2 is connected in parallel with a sensing circuit S/A. The first read current source RCS1 is connected between the first read transistor RD1 and the sensing circuit S/A, and the second read current source RCS2 is connected between the second read transistor RD2 and the sensing circuit S/A. The read circuit RB1 further includes a third read transistor RD3. An end of the third read transistor RD3 is commonly connected to the source lines $SL_1$ and SL; of the memory cell area MA1 and the source line SL' of the reference cell area RA1. The other end of the third read transistor RD3 is grounded. The same signal may be applied to gate electrodes of the first through third read transistors RD1, RD2 and RD3. The sensing circuit S/A, the first and second read current sources RCS1 and RCS2, and the first through third read transistors RD1, RD2 and RD3 of FIG. 5 correspond to the sensing circuit S/A, the first and second read current sources RCS1 and RCS2, and the first through third read transistors RD1, RD2 and RD3 of FIG. 1, respectively.

The control circuit area CA1 is connected to both the memory cell area MA1 and the reference cell area RA1. In the STT-MRAM having the above-described structure, data may be recorded in the memory cell area MA1 and the reference cell area RA1 by using the control circuit area CA1, and data of the memory cell area MA1 may be read by using the control circuit area CA1. When the data of the memory cell area MA1 is read, the reference cell RFC1 is used as a reference (basis).

Only the read/write block RWB1 connected to the leftmost bit lines $BL_m$ and $BL'_m$ is illustrated in the control circuit area CA1 of FIG. 5. However, the control circuit area CA1 may further include at least one additional read/write block. The at least one additional read/write block may be connected to other different bit lines. In addition, a plurality of neighboring bit lines of the bit lines $BL_1$ through $BL_m$ of the memory cell area MA1 may share a single read/write block RWB1 with a plurality of corresponding neighboring bit lines of the bit lines $BL'_1$ through $BL'_m$ of the reference cell area RA1, which will be described in more detail with reference to FIG. 9.

Figure 6A:
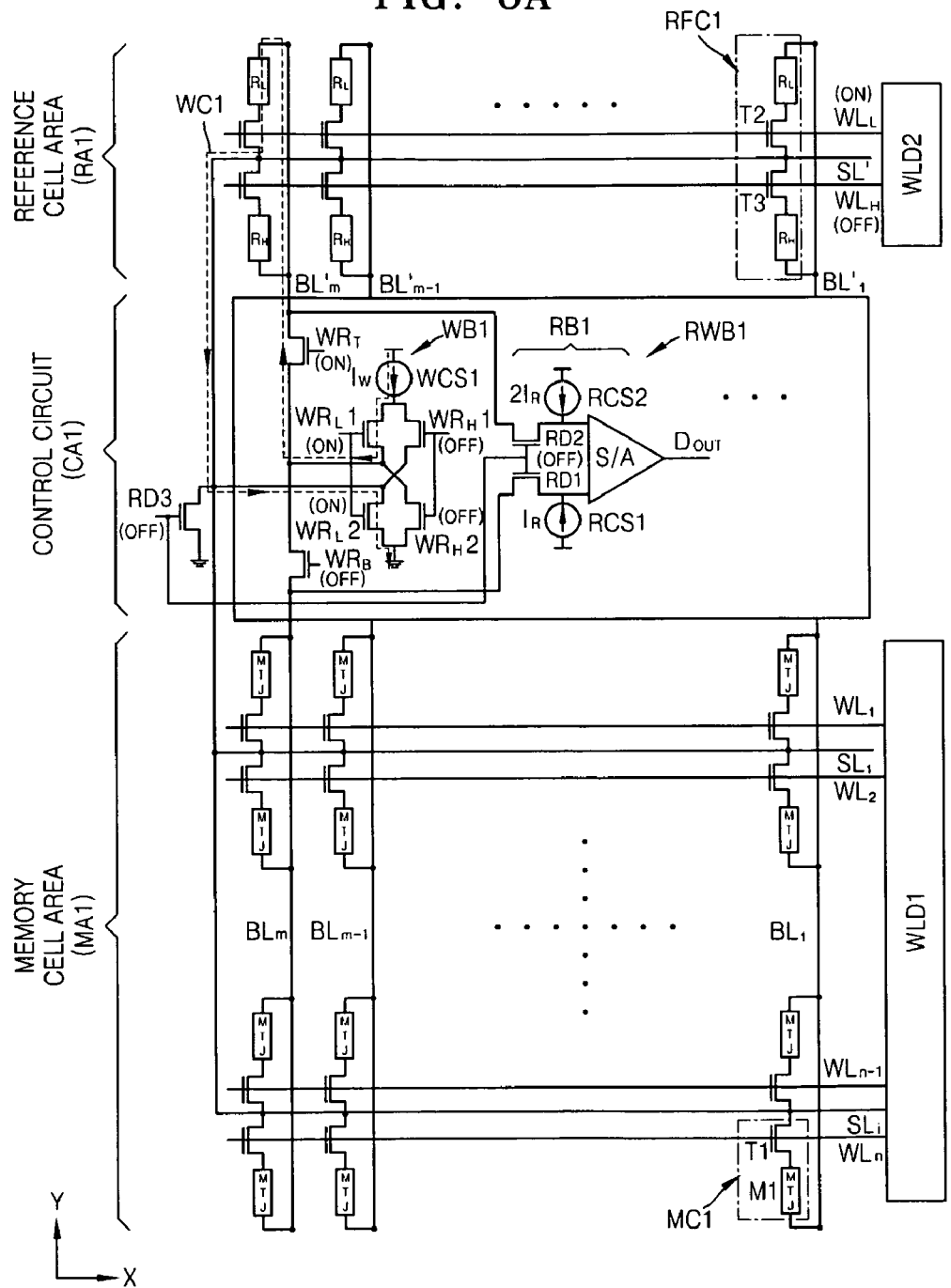
FIGS. 6A through 6E are circuit diagrams for explaining a method of operating a STT-MRAM according to an example embodiment.
Figure 6B:
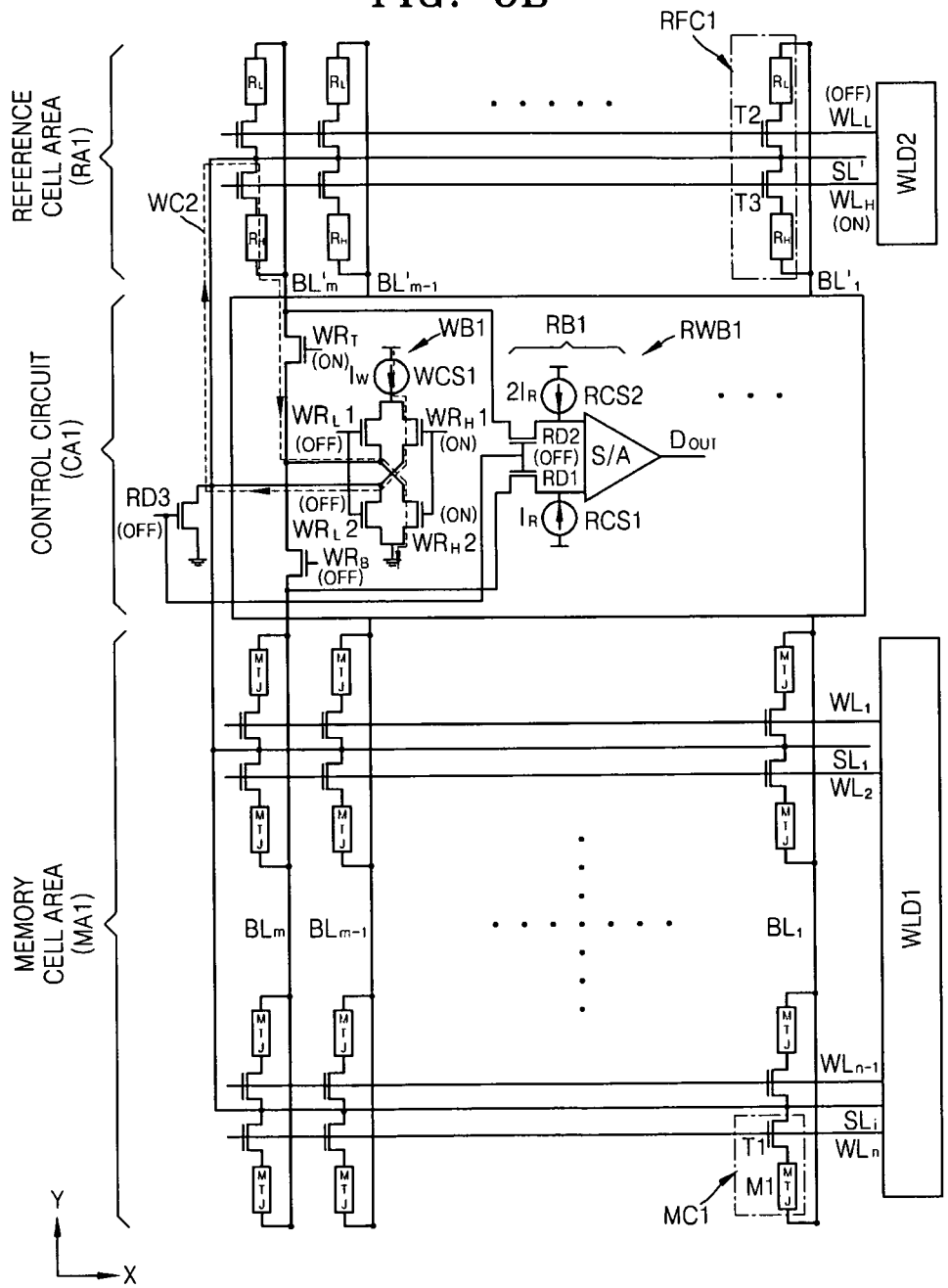
Figure 6C:
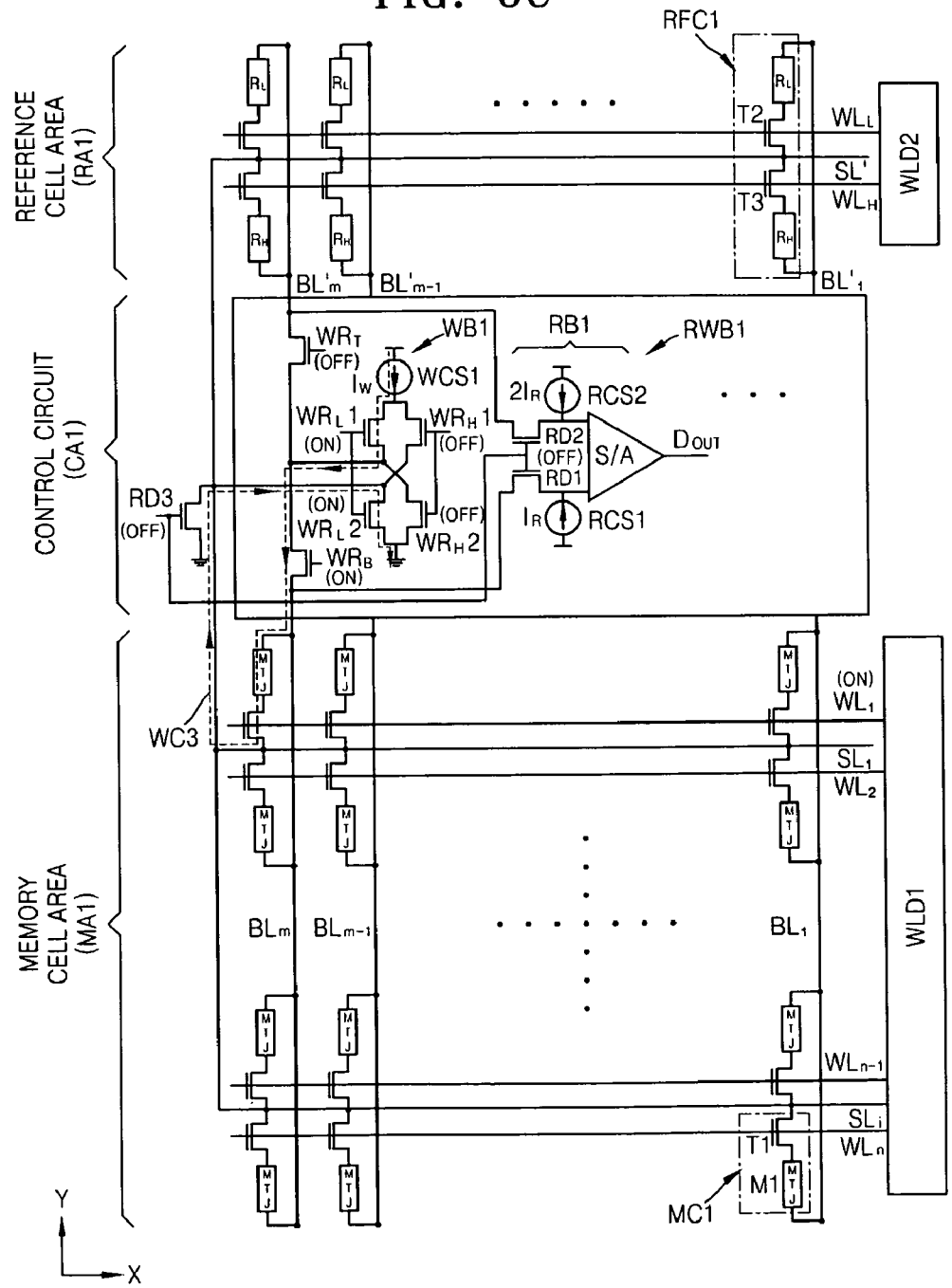
Figure 6D:
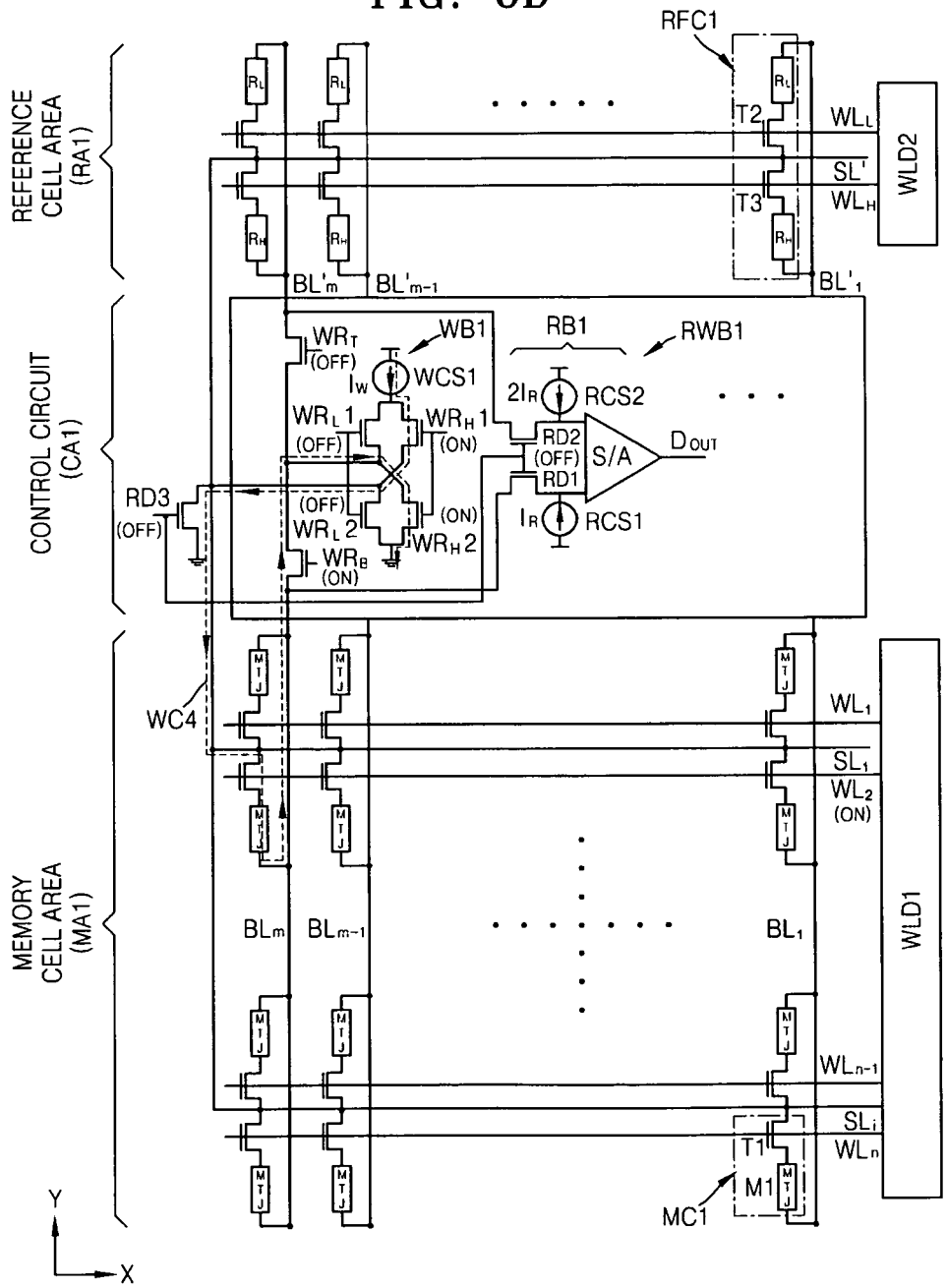
Figure 6E:
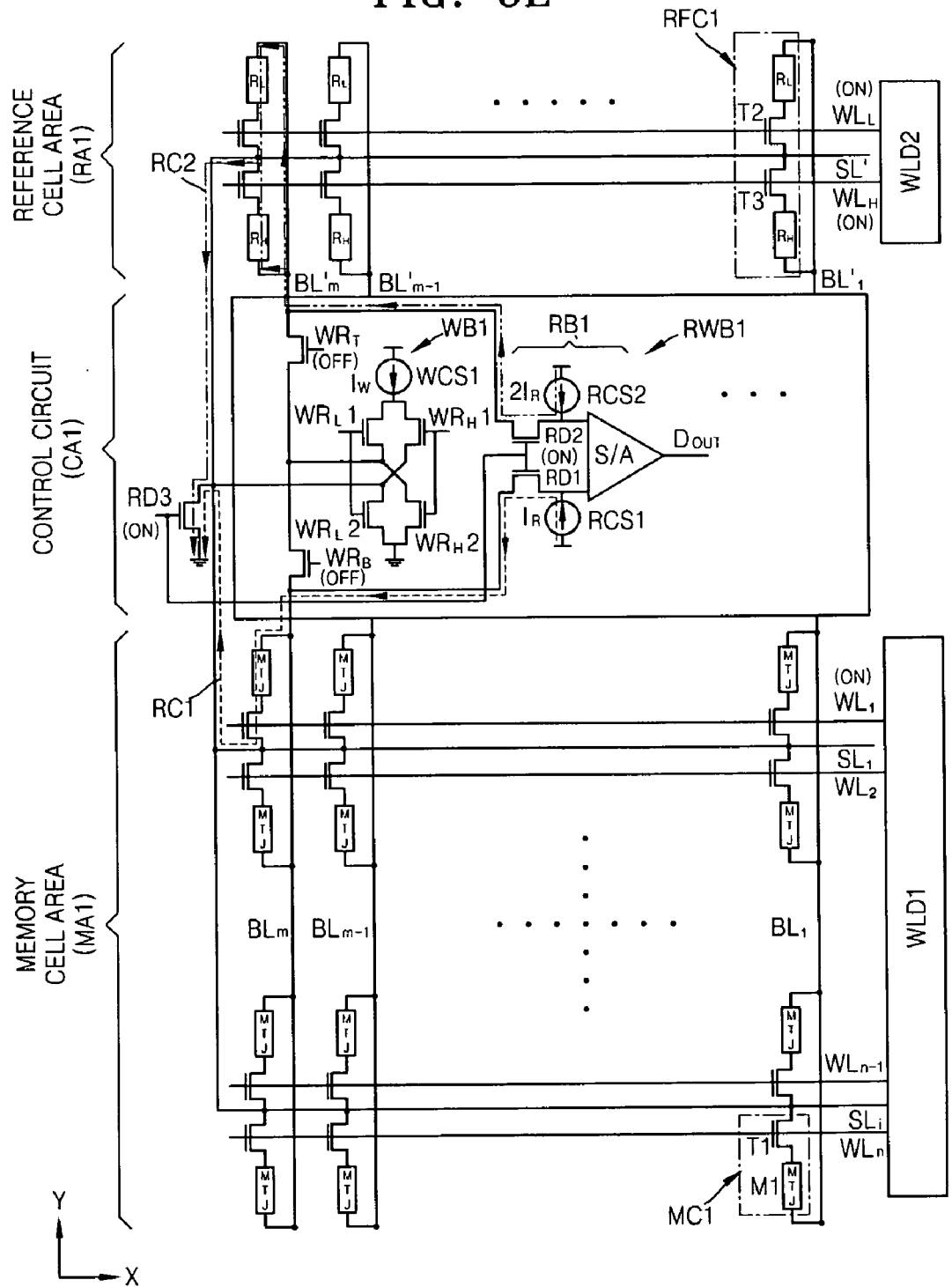

FIGS. 6A through 6E are circuit diagrams for explaining a method of operating the STT-MRAM of FIG. 5 according to an example embodiment. More specifically, FIGS. 6A and 6B are circuit diagrams for explaining a method of recording data in the reference cell area RA1 according to an example embodiment;

FIGS. 6C and 6D are circuit diagrams for explaining a method of recording data in the memory cell area MA1 according to an example embodiment; and FIG. 6E is a circuit diagram for explaining a method of reading data of the memory cell area MA1 according to an example embodiment. The methods of FIGS. 6A and 6E are related to The memory cell area MA1 and the reference cell area RA1 that correspond to the leftmost bit lines $BL_m$ and $BL'_m$ connected to the read/write block RWB1.

Referring to FIG. 6A, data is recorded in the reference cell area RA1 by inputting logic '0' to the first through third read transistors RD1, RD2 and RD3, and the first selection transistor $WR_B$, and inputting logic '1' to the second selection transistor $WR_T$. In this case, logic '0' is input to the second and fourth write transistors $WR_H1$ and $WR_H2$, and the second reference cell word line $WL_H$, whereas logic '1' is input to the first and third write transistors $WR_L1$ and $WR_L2$, and the first reference cell word line $WL_R$. Thus, a first write current WC1 flows from the write current source WCS1 to ground via the first write transistor $WR_L2$, the second selection transistor $WR_T$, the second MTJ element $R_L$, the second transistor T2 and the third write transistor $WR_L2$. The first write current WC1 of FIG. 6A may correspond to the first write current WC1 of FIG. 3A. Thus, in the second MTJ element $R_L$, a free layer is magnetized in the same magnetization direction as that of a fixed layer, and the second MTJ element $R_L$ has a relatively low resistance.

Referring to FIG. 6B, when logic '0' is input to the first through third read transistors RD1, RD2 and RD3, and the first selection transistor $WR_B$, and logic '1' is input to the second selection transistor $WR_T$, logic '0' is input to the first and third write transistors $WR_L1$ and $WR_L2$, and the first reference cell word line $WL_R$, and logic '1' is input to the second and fourth write transistors $WR_H1$ and $WR_H2$, and the second reference cell word line $WL_H$. Thus, a second write current WC2 flows from the write current source WCS1 to ground via the second write transistor $WR_H1$, the third transistor T3, the third MTJ element $R_H$, the second selection transistor $WR_T$, and the fourth write transistor $WR_H2$. The second write current WC2 of FIG. 6B may correspond to the second write current WC2 of FIG. 3B. Thus, in the third MTJ element $R_H$, a free layer is magnetized in a magnetization direction opposite to that of a fixed layer, and the third MTJ element $R_H$ has a relatively high resistance.

As described with reference to FIGS. 6A and 6B, the second and third MTJ elements $R_L$ and $R_H$ of the reference cell RFC1 are configured so as to respectively have a relatively low resistance and a relatively high resistance by using the write circuit WB1. Such an operation may be performed once prior to performing a normal reading operation on the memory cell MC1. In this example, the second and third MTJ elements $R_L$ and $R_H$ are configured so as to have desired resistances in an initial stage, and then a reading operation may be performed on the memory cell MC1 by using the reference cell RFC1 including the second and third MTJ elements $R_L$ and $R_H$.

Referring to FIG. 6C, data is recorded in the memory cell area MA1 by inputting logic '0' to the first through third read transistors RD1, RD2 and RD3, and the second selection transistor $WR_T$, and inputting logic '1' to the first selection transistor $WR_B$. In this case, logic '1' is input to the first and third write transistors $WR_L1$ and $WR_L2$, whereas logic '0' is input to the second and fourth write transistors $WR_H1$ and $WR_H2$. In addition, logic '1' is input to any one of the word lines $WL_1$ through $WL_n$, for example, the first word line $WL_1$. Thus, a third write current WC3 is supplied to the leftmost memory cell (hereinafter, referred to as the selected first memory cell MC1) of a plurality of the memory cells MC1 that is connected to the first word line $WL_1$. In more detail, the third write current WC3 flows from the write current source WCS1 to ground via the first write transistor $WR_L1$, the first selection transistor $WR_B$, the first MTJ element M1 and the first transistor T1 of the selected first memory cell MC1, and the third write transistor $WR_L2$. Thus, a free layer is magnetized in the same magnetization direction as that of a fixed layer in the first MTJ element M1 of the selected first memory cell MC1. Thus, first data corresponding to the relatively low resistance (e.g., minimum or lowest resistance) is recorded in the first MTJ element M1 of the selected first memory cell MC1.

Referring to FIG. 6D, when logic '0' is input to the first through third read transistors RD1, RD2 and RD3, and the second selection transistor $WR_T$, and logic '1' is input to the first selection transistor $WR_B$, logic '1' is input to the second and fourth write transistors $WR_H1$ and $WR_H2$, and logic '0' is input to the first and third write transistors $WR_L1$ and $WR_L2$. In addition, logic '1' is input to any one of the word lines $WL_1$ through $WL_n$, for example, the second word line $WL_2$. Thus, a fourth write current WC4 is supplied to the leftmost memory cell (hereinafter, referred to as the selected second memory cell MC1) of a plurality of the memory cells MC1 connected to the second word line $WL_2$. In more detail, the fourth write current WC4 flows from the write current source WCS1 to ground via the second write transistor $WR_H1$, the first transistor T1 and the first MTJ element M1 of the selected second memory cell MC1, the first selection transistor $WR_B$, and the fourth write transistor $WR_H2$. Thus, a free layer is magnetized in a magnetization direction opposite to that of a fixed layer in the first MTJ element M1 of the selected second memory cell MC1. Thus, second data corresponding to the relatively high resistance (e.g., maximum or highest resistance) is recorded in the first MTJ element M1 of the selected second memory cell MC1.

As shown in FIGS. 6C and 6D, given, desired or predetermined data may be recorded in the memory cell MC1 of the memory cell area MA1 by using the write circuit WB1.

Referring to FIG. 6E, a given, desired or predetermined read current is supplied to the memory cell area MA1 and the reference cell area RA1 by inputting logic '1' to the first through third read transistors RD1, RD2 and RD3 and inputting logic '0' to the first and second selection transistors $WR_B$ and $WR_T$. In this case, logic '1' is input to any one of the word lines $WL_1$ through $WL_n$, for example, the first word line $WL_1$. Thus, data stored in the leftmost memory cell (the selected first memory cell MC1) of a plurality of the memory cells MC1 that is connected to the first word line $WL_1$ is read. Logic '1' is also input to the first and second reference cell word lines $WL_R$ and $WL_H$. Thus, a first read current RC1 flows from the first read current source RCS1 to ground via the selected first memory cell MC1 and the third read transistor RD3. In addition, a second read current RC2 flows from the second read current source RCS2 to ground via the reference cell RFC1 and the third read transistor RD3. In this case, an intensity (magnitude) of the second read current RC2 may be about twice as high as an intensity (magnitude) $I_R$ of the first read current RC1. In this case, because the second and third MTJ elements $R_L$ and $R_H$ of the reference cell RFC1 are connected to each other in parallel, the second read current RC2 branches and then a current having the intensity $I_R$ that is the same or substantially the same as that of a current (e.g., the first read current RC1) supplied to the memory cell MC1 is supplied to each of the second and third MTJ elements $R_L$ and $R_H$. The sensing circuit S/A senses and amplifies a difference between the resistance (hereinafter, referred to as the 'first resistance') of the memory cell MC1 due to the first read current RC1 and the resistance (hereinafter, referred to as the 'second resistance') of the reference cell RFC1 due to the second read current RC2 to identify data stored in the selected first memory cell MC1. According to at least this example embodiment, because the second MTJ element $R_L$ has relatively low resistance (e.g., a minimum or lowest resistance) corresponding to first data of the first MTJ element M1 of the memory cell MC1, and the third MTJ element $R_H$ has relatively high resistance (e.g., a maximum or highest resistance) corresponding to second data of the first MTJ element M1, the second resistance may has an intermediate value between the relatively low resistance and the relatively high resistance. Thus, a sensing margin may be ensured, and reliability of the reading operation may be improved.

Table 1 shows logic signal values that may be input to transistors and word lines according to a driving condition, in the operating methods described with reference to FIGS. 6A through 6E.

TABLE 1

|  | RD1~RD3 | $WR_L1$ $WR_L2$ | $WR_H1$ $WR_H2$ | $WL_L$ | $WL_H$ |
|---|---|---|---|---|---|
| Reference cell $R_L$ Write | 0 | 1 | 0 | 1 | 0 |
| Reference cell $R_H$ Write | 0 | 0 | 1 | 0 | 1 |
| Read | 1 | 0 | 0 | 1 | 1 |

Figure 7:
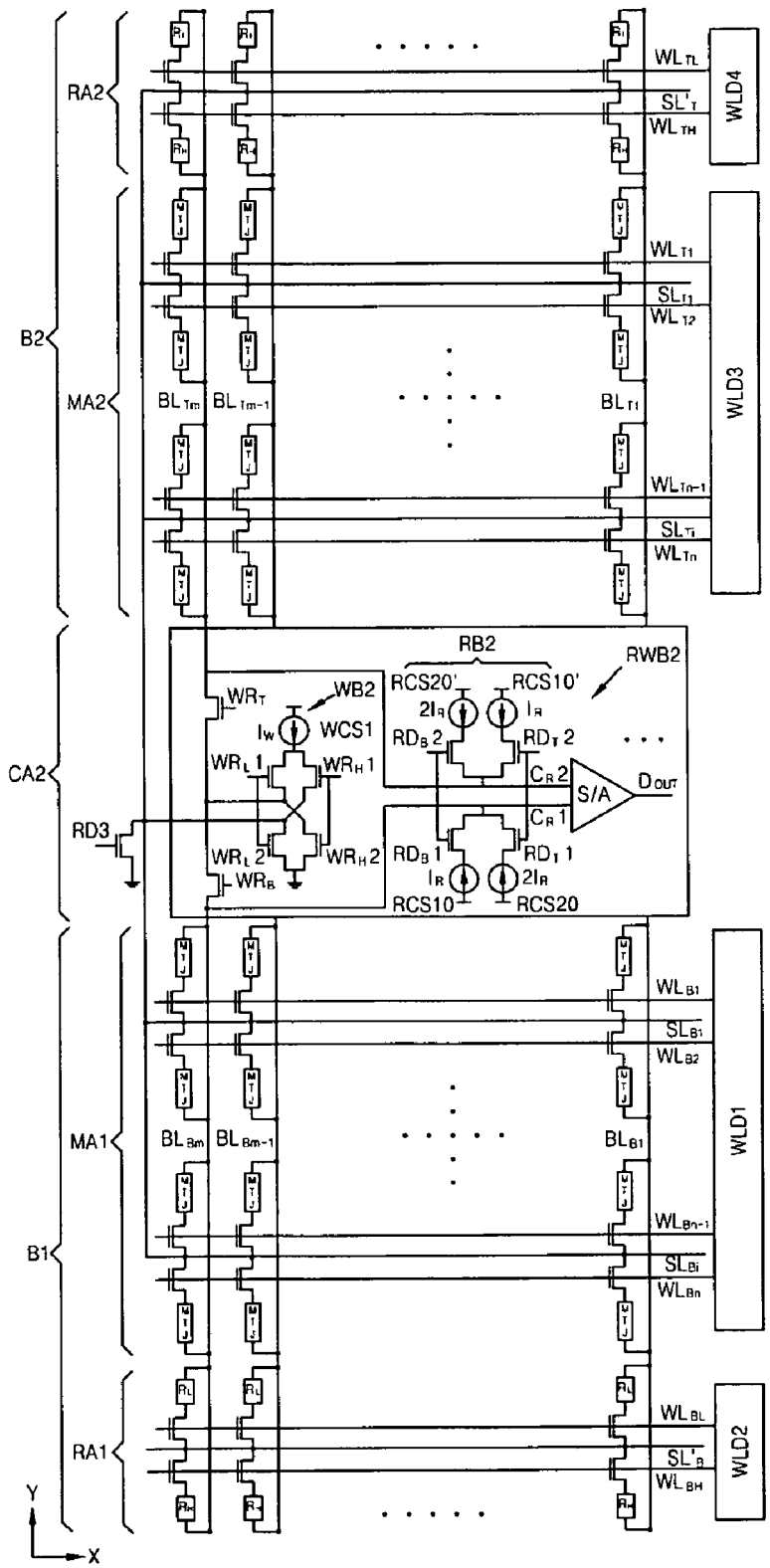
FIG. 7 is a circuit diagram of an array architecture of an STT-MRAM according to another example embodiment.

FIG. 7 is a circuit diagram of an overall array architecture of an STT-MRAM according to another example embodiment. According to the example embodiment shown in FIG. 7, a first memory cell area MA1 and a first reference cell area RA1 are disposed at a first side of a control circuit CA2 (e.g., below the control circuit CA2), and a second memory cell area MA2 and a second reference cell area RA2 are disposed at a second side of the control circuit CA2 (e.g., above the control circuit CA2). In this example, a first cell block (a bottom block B1) including the first memory cell area MA1 and the first reference cell area RA1 share the single control circuit CA2 with a second cell block (a top block B2) including the second memory cell area MA2 and the second reference cell area RA2.

Referring to FIG. 7, the first memory cell area MA1 and the first reference cell area RA1 are sequentially disposed at the first side of the control circuit CA2 (e.g., below the control circuit CA2), and the second memory cell area MA2 and the second reference cell area RA2 are sequentially disposed at the second side of the control circuit CA2 (e.g., above the control circuit CA2). The first memory cell area MA1 and the first reference cell area RA1 constitute the first cell block B1, and the second memory cell area MA2 and the second reference cell area RA2 constitute the second cell block B2. The first memory cell area MA1 may have the same or substantially the same structure as that of the memory cell area MA1 in FIG. 5. Word lines of the first memory cell area MA1 are denoted by $WL_{B1}$ through $WL_{Bn}$, and source lines of the first memory cell area MA1 are denoted by $SL_{B1}$ through $SL_{Bi}$. The first reference cell area RA1 may have the same or substantially the same structure as that of the reference cell area RA1 of FIG. 5. First and second reference cell word lines of the first reference cell area RA1 are denoted by $WL_{BL}$ and $WL_{BH}$, and a reference cell source line of the first reference cell area RA1 is denoted by $SL'_B$. The first memory cell area MA1 and the first reference cell area RA1 share a plurality of bit lines $BL_{B1}$ through $BL_{Bm}$, with each other. A first word line driver WLD1 is disposed at an end of the first memory cell area MA1, whereas a second word line driver WLD2 is disposed at an end of the first reference cell area RA1. The second memory cell area MA2 and the second reference cell area RA2 may have the same or substantially the same structures as the first memory cell area MA1 and the first reference cell area RA1, respectively. Word lines of the second memory cell area MA2 are denoted by $WL_{T1}$ through $WL_{Tn}$, and source lines of the second memory cell area MA2 are denoted by $SL_{T1}$ through $SL_{Tn}$. First and second reference cell word lines of the second reference cell area RA2 are denoted by $WL_{TL}$ and $WL_{TH}$, and a reference cell source line of the second reference cell area RA2 is denoted by $SL'_T$. The second memory cell area MA2 and the second reference cell area RA2 share a plurality of bit lines $BL_{T1}$ through $BL_{Tm}$, with each other. A third word line driver WLD3 is disposed at an end of the second memory cell area MA2, and a fourth word line driver WLD4 is disposed at an end of the second reference cell area RA2.

The control circuit CA2 is disposed between the first cell block B1 and the second cell block B2. The control circuit CA2 is also connected to the first cell block B1 and the second cell block B2. The control circuit CA2 includes at least one read/write block RWB2. The read/write block RWB2 includes: a write circuit WB2 and a read circuit RB2. The write circuit WB2 may have the same or substantially the same structure as the write circuit WB1 of FIG. 5. The read circuit RB2 has a modified structure relative to the read circuit RB1 of FIG. 5. In more detail, the read circuit RB2 includes a wire (hereinafter, referred to as the first read wire $C_R1$) connecting a sensing circuit S/A to the first cell block B1, and a wire (hereinafter, referred to as the second read wire $C_R2$) connecting the sensing circuit S/A to the second cell block B2. The first and second read wires $C_R1$ and $C_R2$ are connected to the sensing circuit S/A in parallel. A first memory cell-reading current source RCS10 and a first reference cell-reading current source RCS20 are connected to the first read wire $C_R1$ in parallel. A second reference cell-reading current source RCS20' and a second memory cell-reading current source RCS10' are connected to the second read wire $C_R2$. A 1-1 read transistor $RD_B1$ is disposed between the first read wire $C_R1$ and the first memory cell-reading current source RCS10. A 2-1 read transistor $RD_T1$ is disposed between the first read wire $C_R1$ and the first reference cell-reading current source RCS20. A 1-2 read transistor $RD_B2$ is disposed between the second read wire $C_R2$ and the second reference cell-reading current source RCS20'. A 2-2 read transistor $RD_T2$ is disposed between the second read wire $C_R2$ and the second memory cell-reading current source RCS10'. The same signal may be applied to gate electrodes of the 1-1 read transistor $RD_B1$ and the 1-2 read transistor $RD_B2$, and the same signal may be applied to gate electrodes of the 2-1 read transistor $RD_T1$ and the 2-2 read transistor $RD_T2$. An end of a third read transistor RD3 is connected to the source lines $SL_{B1}$ through $SL_{Bi}$, $SL'_B$, $SL_{T1}$ through $SL_{Ti}$, and $SL'_T$ of the first and second cell blocks B1 and B2, and the other end of the third read transistor RD3 is grounded. A gate electrode of the third read transistor RD3 is not connected to gate electrodes of other read transistors $RD_B1$, $RD_B2$, $RD_T1$ and $RD_T2$.

In comparison with a case where a single control circuit is used for a cell block, as shown in FIG. 5, an area of memory cell areas may be increased compared to an area of control circuits when the first and second cell blocks B1 and B2 share the control circuit CA2, as shown in FIG. 7.

FIG. 7 illustrates a case where only the read/write block RWB2 connected to the leftmost bit lines $BL_{Bm}$ and $BL_{Tm}$ is included in the control circuit CA2. However, the control circuit CA2 may further include at least one additional read/write block, may be connected to other different bit lines. In addition, a plurality of neighboring bit lines of the first cell block B1 may share a read/write block RWB2 with a plurality of corresponding neighboring bit lines of the second cell block B2.

Figure 8A:
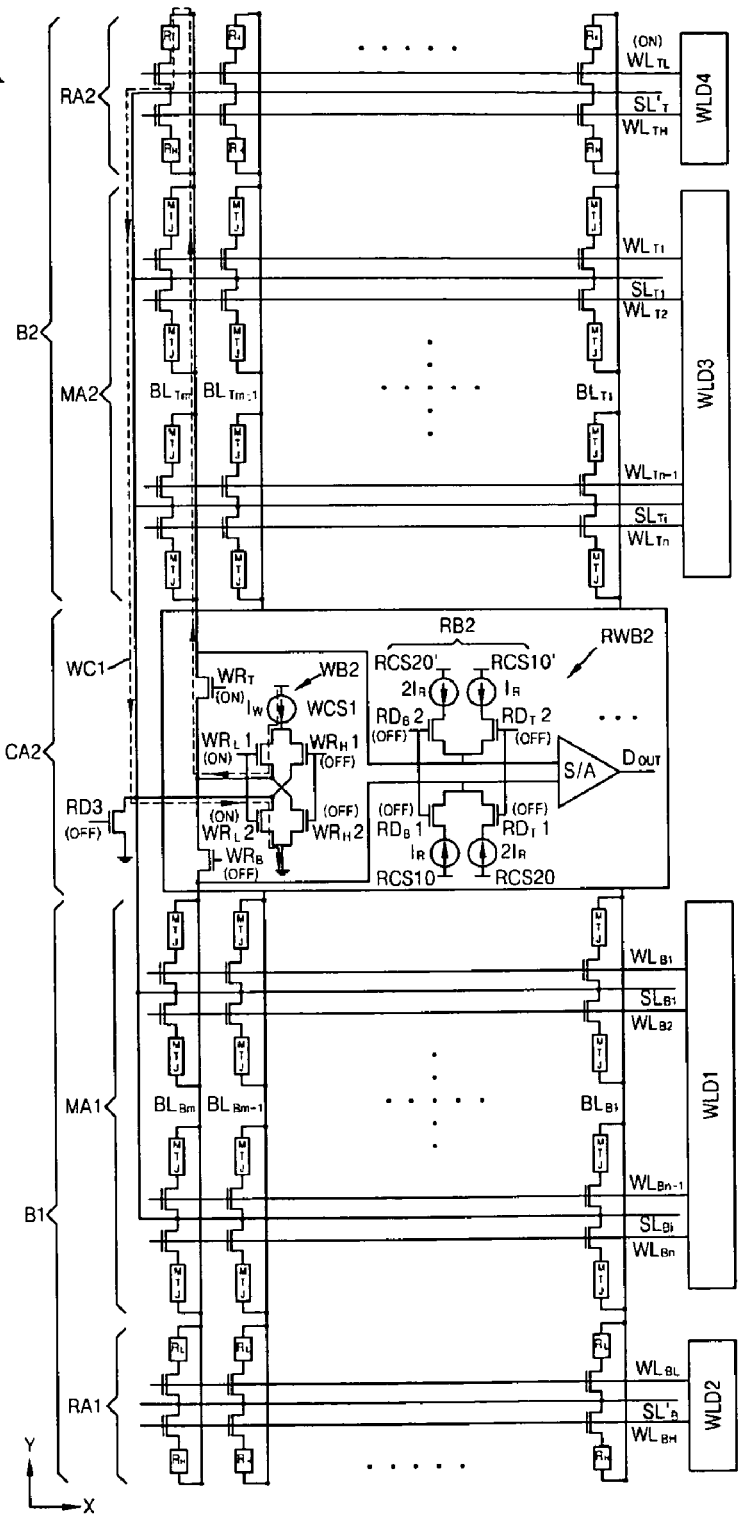
FIGS. 8A through 8E are circuit diagrams for explaining a method of operating a STT-MRAM according to another example embodiment.
Figure 8B:
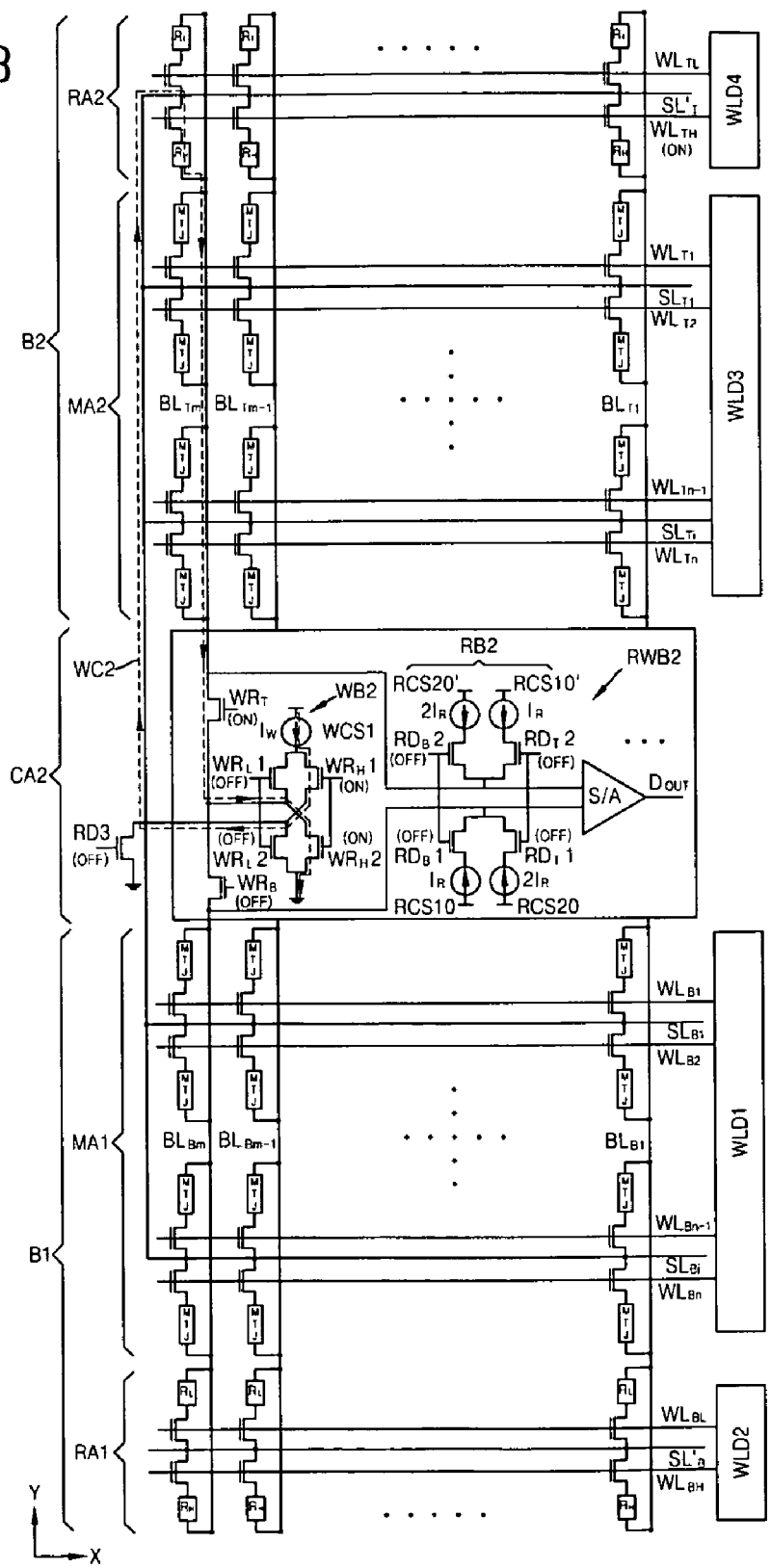
Figure 8C:
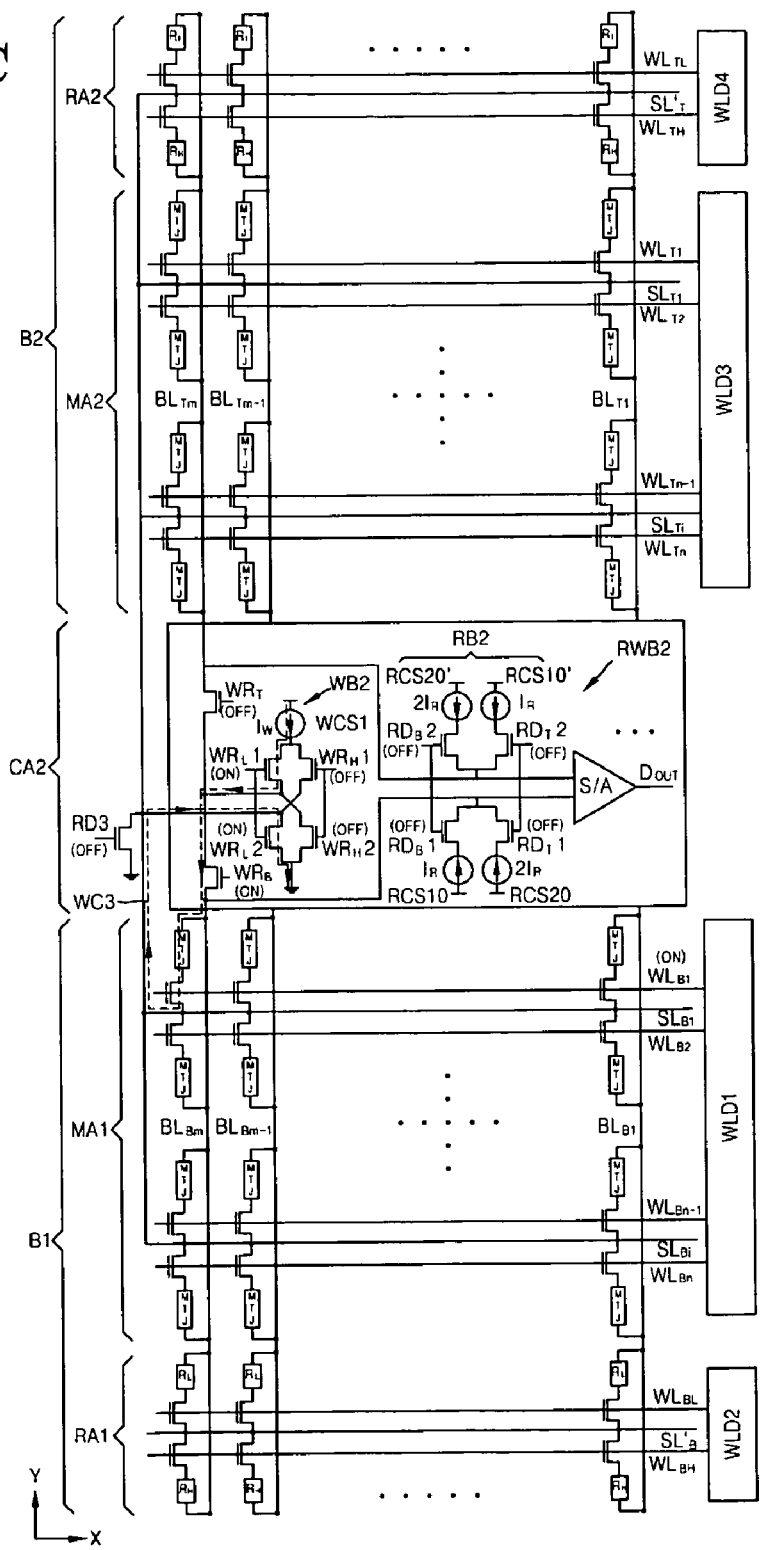
Figure 8D:
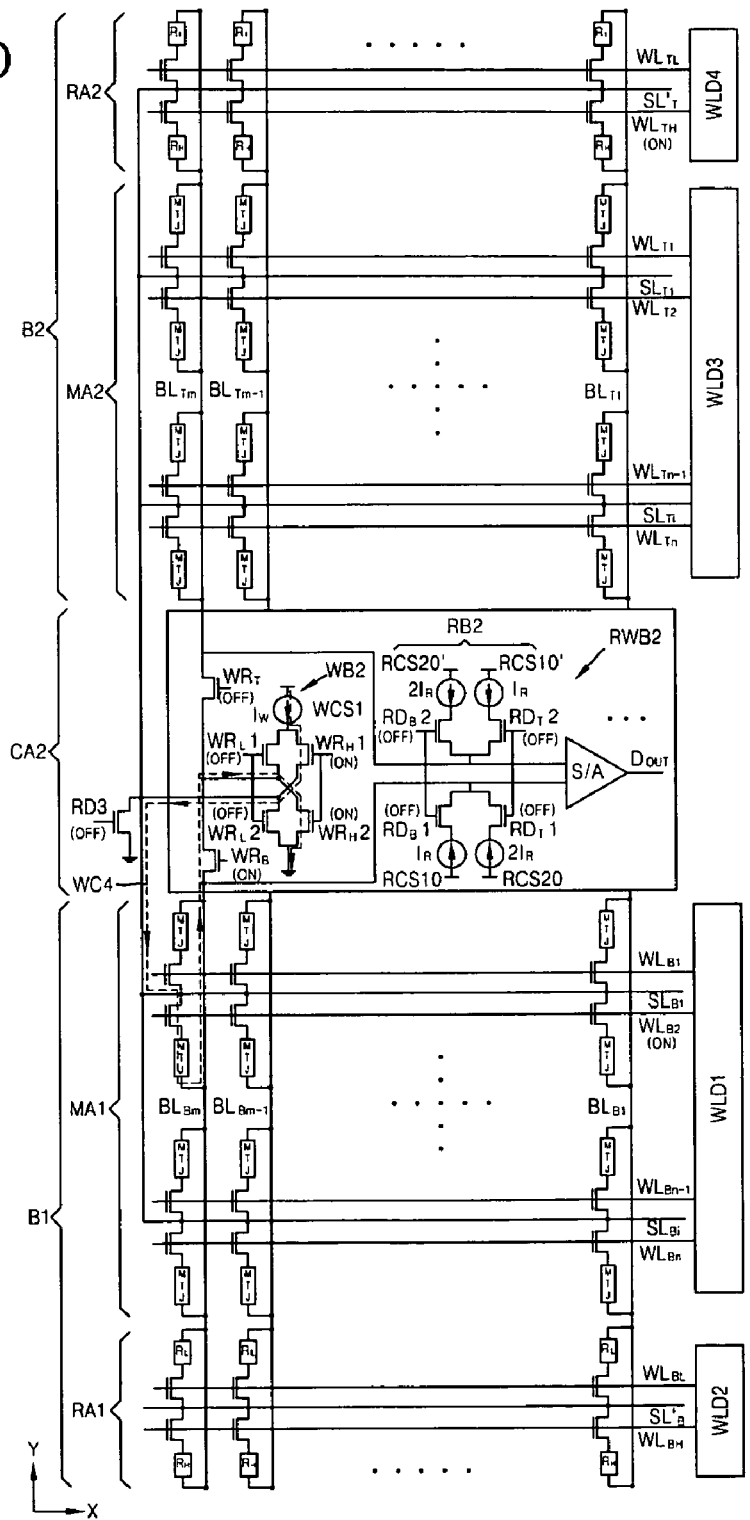
Figure 8E:
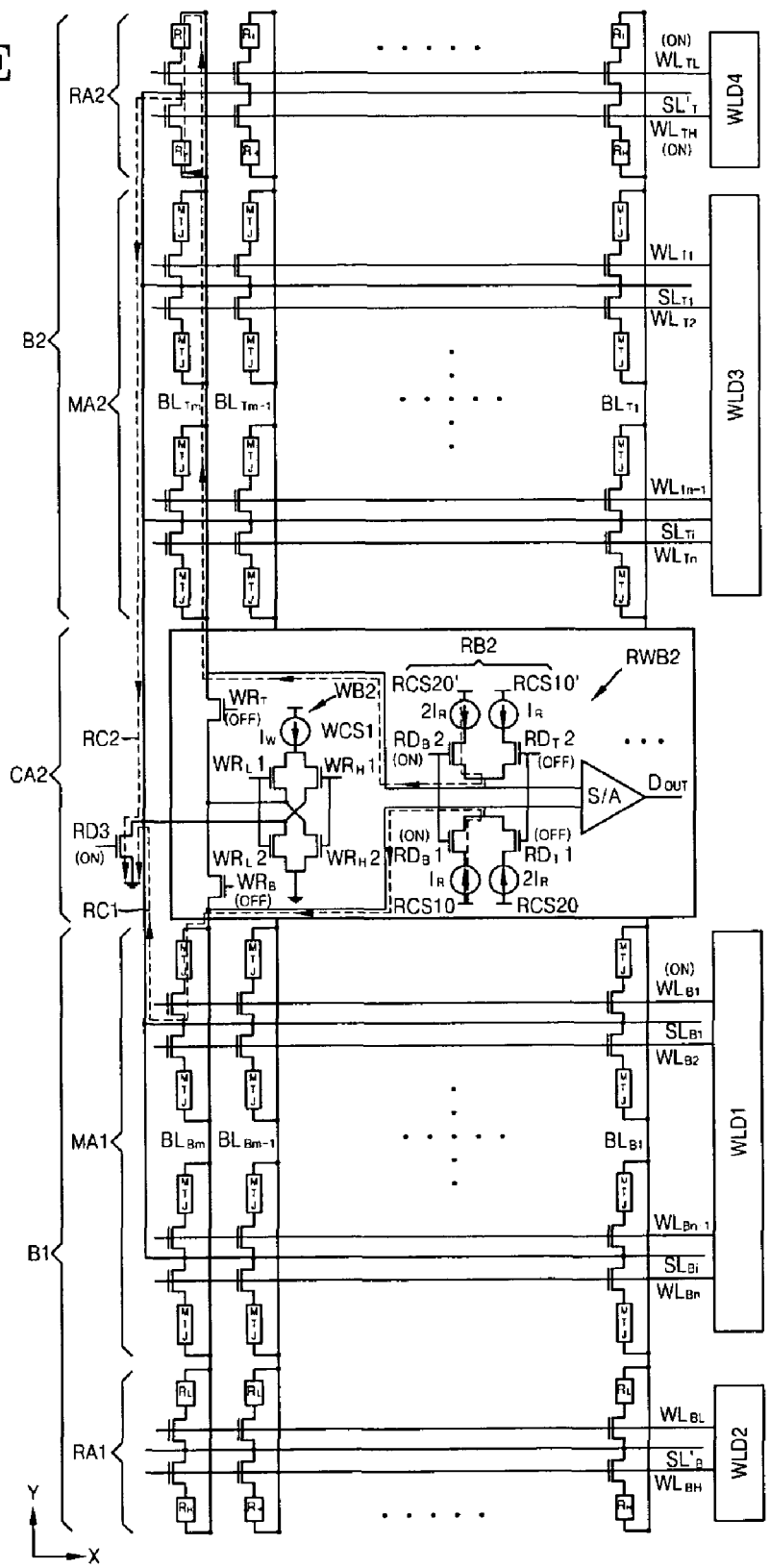

FIGS. 8A through 8E are circuit diagrams for explaining a method of operating the STT-MRAM of FIG. 7 according to an example embodiment. In more detail, FIGS. 8A and 8B are circuit diagrams for explaining an example embodiment of a method of recording data in the reference cell area RA2, FIGS. 8C and 8D are circuit diagrams for explaining an example embodiment of a method of recording data in the memory cell area MA1, and FIG. 8E is a circuit diagram for explaining an example embodiment of a method of reading data of the memory cell area MA1. The methods of FIGS. 8A to 8E are related to portions of the first and second cell blocks B1 and B2 that correspond to the leftmost bit lines $BL_{Bm}$ and $BL_{Tm}$ connected to the read/write block RWB2.

Referring to FIG. 8A, when a reading path is shut off by inputting logic '0' to all of the read transistors $RD_B1$, $RD_B2$, $RD_T1$, $RD_T2$ and RD3, data is recorded in the second reference cell area RA2 by inputting logic '1' to the second selection transistor $WR_T$ and inputting logic '0' to the first selection transistor $WR_B$. In this case, a first write current WC1 is supplied to the leftmost second MTJ element $R_L$ of a plurality of the second MTJ element $R_L$ connected to the first reference cell word line $WL_{TL}$ by inputting logic '1' to the first and third write transistors $WR_L1$ and $WR_L2$, inputting logic '0' to the second and fourth write transistors $WR_H1$ and $WR_H2$, and inputting logic '1' to the first reference cell word line $WL_{TL}$ of the second reference cell area RA2.

Referring to FIG. 8B, when logic '0' is input to all of the read transistors $RD_B1$, $RD_B2$, $RD_T1$, $RD_T2$ and RD3, and the first selection transistor $WR_B$, and logic '1' is input to the second selection transistor $WR_T$, a second write current WC2 is supplied to the leftmost third MTJ element $R_H$ of a plurality of the third MTJ element $R_H$ connected to the second reference cell word line $WL_{TH}$ by inputting logic '0' to the first and third write transistors $WR_L1$ and $WR_L2$, inputting logic '1' to the second and fourth write transistors $WR_H1$ and $WR_H2$, and inputting logic '1' to the second reference cell word line $WL_{TH}$ of the second reference cell area RA2.

In the method of FIGS. 8A and 8B, if logic '1' is input to the first selection transistor $WR_B$, and logic '0' is input to the second selection transistor $WR_T$, a writing operation is performed on the first reference cell area RA1. In this case, logic '1' is input to the first reference cell word line $WL_{BL}$ or the second reference cell word line $WL_{BH}$ of the first reference cell area RA1.

Referring to FIG. 8C, when a read path is shut off by inputting logic '0' to all of the read transistors $RD_B1$, $RD_B2$, $RD_T1$, $RD_T2$ and RD3, data is recorded in the first memory cell area MA1 by inputting logic '1' to the first selection transistor $WR_B$ and inputting logic '0' to the second selection transistor $WR_T$. In this case, logic '1' is input to the first and third write transistors $WR_L1$ and $WR_L2$, and logic '0' is input to the second and fourth write transistors $WR_H1$ and $WR_H2$. In addition, logic '1' is input to any one of a plurality of word lines $WL_{B1}$ through $WL_{Bn}$ of the first memory cell area MA1, for example, the first word line $WL_{B1}$. Thus, a third write current WC3 is supplied to the leftmost memory cell (hereinafter, referred to as the selected first memory cell MC1) of a plurality of the memory cells MC1, which is connected to the first word line $WL_{B1}$.

Referring to FIG. 8D, when a reading path is shut off by inputting logic '0' to all of the read transistors $RD_B1$, $RD_B2$, $RD_T1$, $RD_T2$ and RD3, logic '1' is input to the first selection transistor $WR_B$, and logic '0' is input to the second selection transistor $WR_T$, logic '1' is input to the second and fourth write transistors $WR_H1$ and $WR_H2$ and logic '0' is input to the first and third write transistors $WR_L1$ and $WR_L2$. In addition, logic '1' is input to any one of the word lines $WL_{B1}$ through $WL_{Bn}$ of the first memory cell area MA1, for example, the second word line $WL_{B2}$. Thus, a fourth write current WC4 is supplied to the leftmost memory cell (hereinafter, referred to as the selected second memory cell MC1) of a plurality of the memory cells MC1 connected to the second word line $WL_{B2}$.

In the method of FIGS. 8C and 8D, if logic '0' is input to the first selection transistor $WR_B$, logic '1' is input to the second selection transistor $WR_T$, logic '1' is input to any one of a plurality of word lines $WL_{T1}$ through $WL_{Tn}$ of the second memory cell area MA2, a writing operation is performed on the second memory cell area MA2.

FIG. 8E shows an example embodiment of a method of reading data of the first memory cell area MA1 by using the STT-MRAM of FIG. 7. According to at least this example embodiment, the reference cell RFC1 of the second reference cell area RA2 is used to read the data of the first memory cell area MA1.

Referring to FIG. 8E, when a writing path is shut off by inputting logic '0' to the first and second selection transistor $WR_B$ and $WR_T$, logic '1' is input to the 1-1 read transistor $RD_B1$, the 1-2 read transistor $RD_B2$ and the third read transistor RD3, and logic '0' is input to the 2-1 read transistor $RD_T1$ and the 2-2 read transistor $RD_T2$. In addition, logic '1' is input to any one of the word lines $WL_{B1}$ through $WL_{Bn}$ of the first memory cell area MA1, for example, the first word line $WL_{B1}$, and logic '1' is input to the first and second reference cell word lines $WL_{TL}$ and $WL_{TH}$ of the second reference cell area RA2. Thus, a first read current RC1 is supplied from the first memory cell-reading current source RCS10 to the selected memory cell MC1 of the first memory cell area MA1, and a second read current RC2 is supplied from the second reference cell-reading current source RCS20' to the selected reference cell RFC1 of the second reference cell area RA2.

If logic '0' is input to the 1-1 read transistor $RD_B1$ and the 1-2 read transistor $RD_B2$, and logic '1' is input to the 2-1 read transistor $RD_T1$, the 2-2 read transistor $RD_T2$ and the third read transistor RD3, data of the second memory cell area MA2 is read using the reference cell RFC1 of the first reference cell area RA1.

Table 2 shows logic signal values that may be input to transistors and word lines according to a driving condition in the operating method described with reference to FIGS. 8A through 8E.

TABLE 2

|  | $RD_B1$ $RD_B2$ | $RD_T1$ $RD_T2$ | RD3 | $WR_L1$ $WR_L2$ | $WR_H1$ $WR_H2$ | $WL_{BL}$ | $WL_{BH}$ | $WL_{TL}$ | $WL_{TH}$ |
|---|---|---|---|---|---|---|---|---|---|
| RA1 $R_L$ Write | 0 | 0 | 0 | 1 | 0 | 1 | 0 | 0 | 0 |
| RA1 | 0 | 0 | 0 | 0 | 1 | 0 | 1 | 0 | 0 |

TABLE 2-continued

|  | $RD_B1$ $RD_B2$ | $RD_T1$ $RD_T2$ | RD3 | $WR_L1$ $WR_L2$ | $WR_H1$ $WR_H2$ | $WL_{BL}$ | $WL_{BH}$ | $WL_{TL}$ | $WL_{TH}$ |
|---|---|---|---|---|---|---|---|---|---|
| $R_H$ Write RA2 | 0 | 0 | 0 | 1 | 0 | 0 | 0 | 1 | 0 |
| $R_L$ Write RA2 | 0 | 0 | 0 | 0 | 1 | 0 | 0 | 0 | 1 |
| $R_H$ Write MA1 | 1 | 0 | 1 | 0 | 0 | 0 | 0 | 1 | 1 |
| Read MA2 Read | 0 | 1 | 1 | 0 | 0 | 1 | 1 | 0 | 0 |

Figure 9:
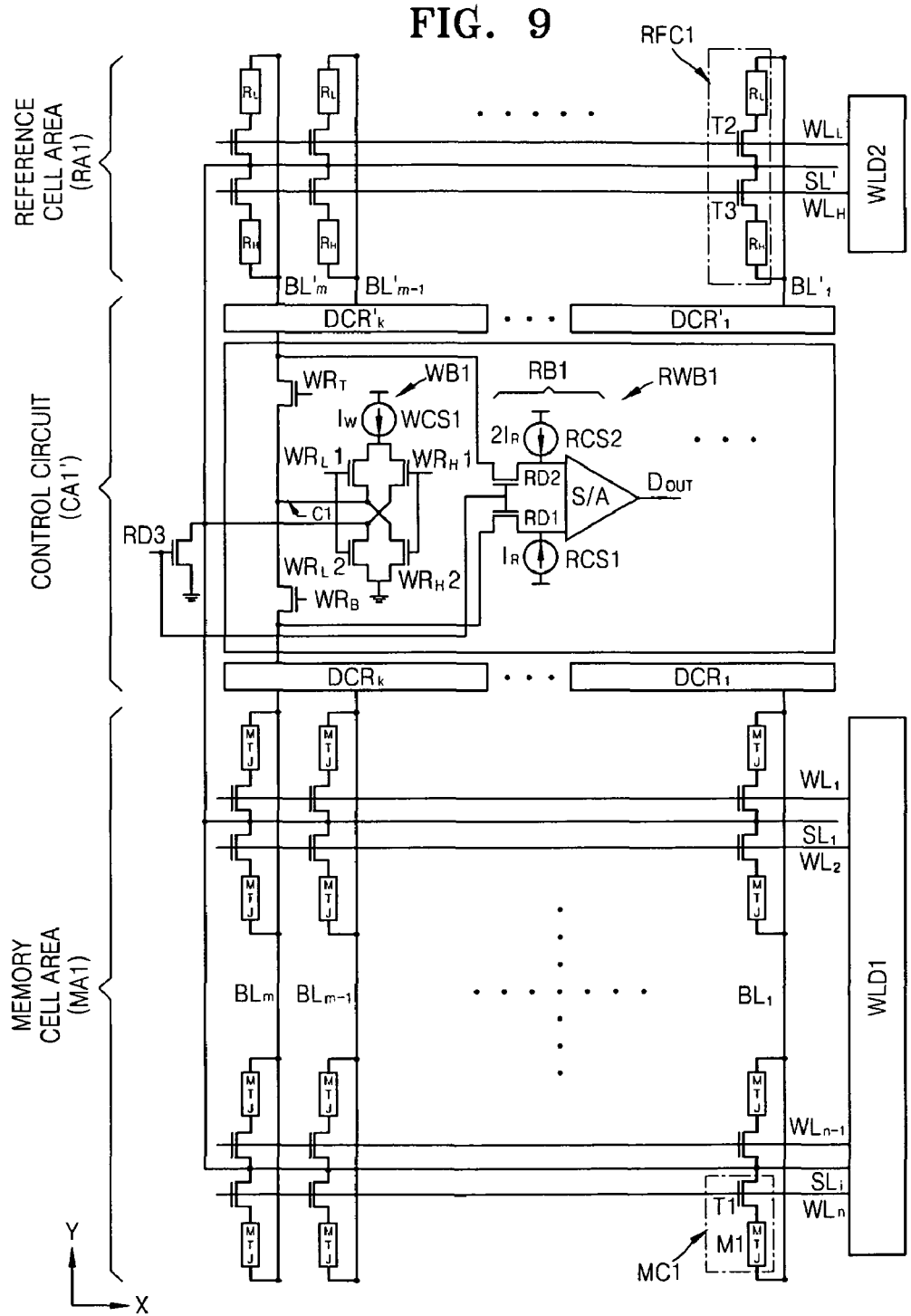
FIG. 9 is a circuit diagram of an array architecture of a STT-MRAM according to another example embodiment.

According to at least one other example embodiment, at least one decoder may be used in the structures of FIGS. 5 and 7, which is illustrated in FIG. 9. FIG. 9 shows an example in which a decoder is used in the structure of FIG. 5.

Referring to FIG. 9, at least one first decoder (e.g., a plurality of first decoders $DCR_1$ through $DCR_k$) is disposed between a control circuit CA1' and a memory cell area MA1. At least one second decoder (e.g., a plurality of second decoders $DCR'_1$ through $DCR'_k$) is disposed between the control circuit CA1' and a reference cell area RA1. The plurality of first and second decoders $DCR_1$ through $DCR_k$, and $DCR'_1$ through $DCR'_k$ are regarded as a part of the control circuit CA1'. A plurality of neighboring ones of the bit lines $BL_1$ through $BL_m$ of the memory cell area MA1 are commonly connected to each of the first decoders $DCR_1$ through $DCR_k$. Each of the first decoders $DCR_1$ through $DCR_k$ are connected to a single read/write block RWB1. Similarly, a plurality of neighboring ones of bit lines $BL'_1$ through $BL'_m$ of the reference cell area RA1 are commonly connected to each of the second decoders $DCR'_1$ through $DCR'_k$, and each of the second decoders $DCR'_1$ through $DCR'_k$ are connected to a single read/write block RWB1. For example, a plurality of neighboring ones of the bit lines $BL_1$ through $BL_m$ of the memory cell area MA1 and a plurality of neighboring ones of the bit lines $BL'_1$ through $BL'_m$ of the reference cell area RA1 share the single read/write block RWB1. Reading/writing operations may be performed by selecting any of the bit lines $BL_1$ through $BL_m$ of the memory cell area MA1 and any of the bit lines $BL'_1$ through $BL'_m$ of the reference cell area RA1 by using the first and second decoders $DCR_1$ through $DCR_k$, and $DCR'_1$ through $DCR'_k$. As such, when the first and second decoders $DCR_1$ through $DCR_k$, and $DCR'_1$ through $DCR'_k$ are used, an area of the control circuit CA1' may be reduced because the number of read/write blocks RWB1 may be reduced. In addition, while maintaining the number of the bit lines $BL_1$ through $BL_m$ of the memory cell area MA1, the number of the bit lines $BL'_1$ through $BL'_m$ of the reference cell area RA1 may be reduced, thereby reducing an area of the reference cell area RA1. Although not illustrated, a decoder may be used in the structure of FIG. 7.

Figure 10:
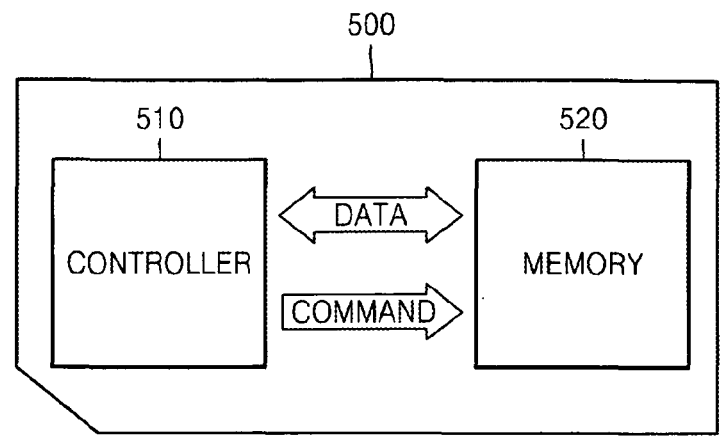
FIG. 10 is a schematic diagram roughly illustrating a memory card according to an example embodiment.

FIG. 10 is a schematic diagram illustrating a memory card 500 according to an example embodiment. Referring to FIG. 10, a controller 510 and a memory 520 exchange electric signals. For example, the memory 520 and the controller 510 may exchange data according to commands of the controller 510. Accordingly, the memory card 500 may either store data in the memory 520 or output data from the memory 520. The memory 520 may include a memory (e.g., an STT-MRAM) as described above with reference to FIGS. 1 through 9.

Such a memory card 500 may be used as a storage medium for various portable electronic devices. For example, the memory card 500 may be a multimedia card (MMC) or a secure digital (SD) card.

Figure 11:
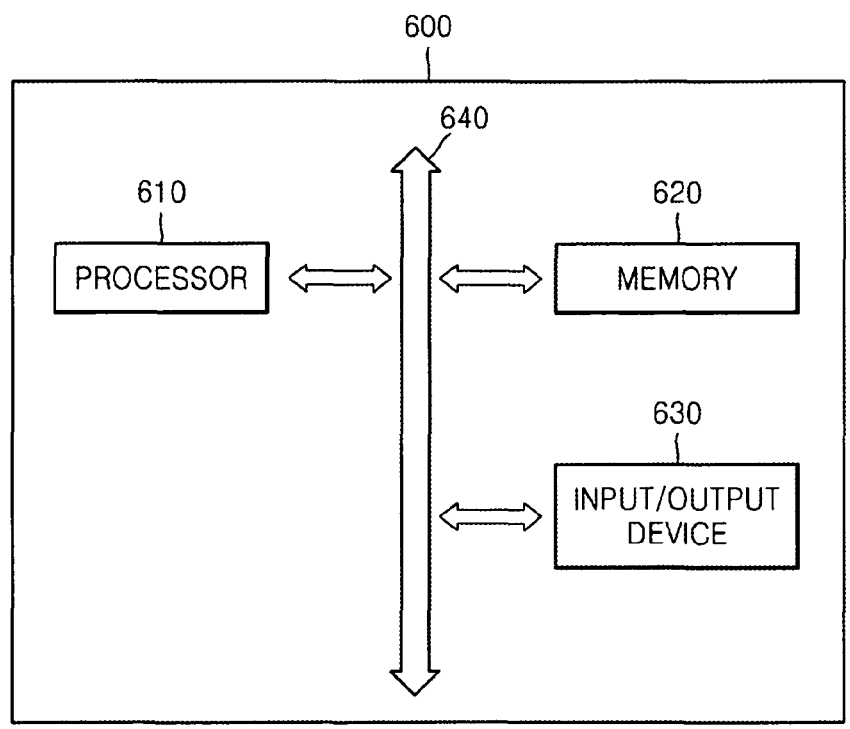
FIG. 11 is a block diagram roughly illustrating an electronic system according to an example embodiment.

FIG. 11 is a block diagram roughly illustrating an electronic system according to an example embodiment. Referring to FIG. 11, a processor 610, an input/output device 630, and a memory 620 perform data communication with each other by using a bus 640. The processor 610 executes a program and controls the electronic system 600. The input/output device 630 is used to input/output data to/from the electronic system 600. The electronic system 600 is connected to an external device (e.g., a personal computer or a network) by the input/output device 630 and exchanges data with the external device.

The memory 620 stores codes and/or programs for operations of the processor 610. For example, the memory 620 may include a memory (e.g., an SIT-MRAM) described above with reference to FIGS. 1 through 9.

The electronic system 600 may embody various electronic control systems requiring the memory 620, and for example, may be used in mobile phones, MP3 players, navigation devices, solid state disks (SSD), or household appliances.

It should be understood that the example embodiments described herein should be considered in a descriptive sense only and not for purposes of limitation. For example, it will be understood by one of ordinary skill in the art that the idea and principle of the example embodiments may be used in another memory device in addition to an STT-MRAM. Any storage element having a resistance that varies according to a supplied current may be used instead of an MTJ element. Thus, the idea of the example embodiments may be used in a memory device using another storage element, apart from the MTJ element. In addition, the structure of the memory devices according to example embodiments may be modified and Changed. Also, it will be understood by one of ordinary skill in the art that the method of FIGS. 3A through 3C, FIGS. 6A through 6E, and FIGS. 8A through 8E may also be variously changed. Furthermore, descriptions of features or aspects within each example embodiment should typically be considered as available for other similar features or aspects in other example embodiments.

What is claimed is:

1. A spin transfer torque magnetic random access memory (STT-MRAM) comprising:
   at least one memory cell including a first magnetic tunneling junction (MTJ) element and a first transistor connected to the first MTJ element;
   at least one reference cell including second and third MTJ elements connected in parallel, and second and third transistors that are connected to the second and third MTJ elements, respectively, the reference cell being configured to operate as a reference during a read operation; and
   a control circuit configured to supply opposite write currents to the second and third MTJ elements, respectively.

2. The STT-MRAM of claim 1, wherein one of the second and third MTJ elements has a low resistance corresponding to first data of the first MTJ element, and one of the second and third MTJ elements has a high resistance corresponding to second data of the first MTJ element.

3. The STT-MRAM of claim 1, wherein the control circuit comprises:
   a write circuit including,
      a write current source,
      first and second write transistors connected in parallel with the write current source,
      a third write transistor connected to the second write transistor, and
      a fourth write transistor connected to the first write transistor, wherein
      the first and fourth write transistors are connected to an end of each of the second and third MTJ elements,
      the second and third write transistors are connected to an end of each of the second and third transistors, and
      the third and fourth write transistors are grounded.

4. The STT-MRAM of claim 3, wherein the write circuit is connected to the memory cell.

5. The STT-MRAM of claim 4, wherein the first and fourth write transistors are connected to an end of the first MTJ element, and the second and third write transistors are connected to an end of the first transistor.

6. The STT-MRAM of claim 5, further comprising:
   a first selection transistor connected between the write circuit and the memory cell; and
   a second selection transistor connected between the write circuit and the reference cell.

7. The STT-MRAM of claim 1, wherein the control circuit comprises:
   a read circuit configured to supply first and second read currents to the memory cell and the reference cell, respectively; wherein
   a magnitude of the second read current is greater than that of the first read current.

8. The STT-MRAM of claim 1, wherein the control circuit comprises:
   a read circuit including,
      a first read current source connected to the memory cell,
      a first read transistor connected between the memory cell and the first read current source,
      a second read current source connected to the reference cell,
      a second read transistor connected between the reference cell and the second read current source,
      a sensing circuit to which the first and second read transistors are connected in parallel, and
      a third read transistor having a first end connected to the first through third transistors, and a second end that is grounded.

9. The STT-MRAM of claim 1, further comprising:
   a memory cell area including a plurality of the memory cells; and
   a reference cell area including a plurality of the reference cells; wherein
   the control circuit is disposed between the memory cell area and the reference cell area.

10. The STT-MRAM of claim 9, wherein the memory cell area includes,
    a plurality of first word lines,
    a plurality of first bit lines that intersect the plurality of first word lines,
    at least one of the plurality of memory cells disposed at each intersection between the plurality of first word lines and the plurality of first bit lines, and
    a first source line disposed between neighboring ones of the plurality of first word lines; and wherein the reference cell area includes,
    first and second reference cell word lines disposed in parallel with the plurality of first word lines,
    a plurality of second bit lines that intersect the first and second reference cell word lines,
    at least one of the plurality of reference cells disposed at each intersection between the plurality of second bit lines and the first and second reference cell word lines, and a second source line disposed between the first and second reference cell word lines.

11. The STT-MRAM of claim 10, wherein the control circuit comprises:
at least one read/write block connected to the reference cell area and the memory cell area; wherein
the read/write block includes a write circuit and a read circuit.

12. The STT-MRAM of claim 11, wherein the write circuit comprises:
a write current source;
first and second write transistors connected in parallel with the write current source;
a third write transistor connected to the second write transistor; and
a fourth write transistor connected to the first write transistor; wherein
the first and fourth write transistors are connected to one of the plurality of first bit lines and one of the plurality of second bit lines,
the second and third write transistors are connected to the first and second source lines, and
the third and fourth write transistors are grounded.

13. The STT-MRAM of claim 11, further comprising:
a first selection transistor connected between one of the plurality of first bit lines and the write circuit; and
a second selection transistor connected between one of the plurality of second bit lines and the write circuit.

14. The STT-MRAM of claim 11, wherein the read circuit comprises:
a first read current source connected to one of the plurality of first bit lines;
a first read transistor connected between one of the plurality of first bit lines and the first read current source;
a second read current source connected to one of the plurality of second bit lines;
a second read transistor connected between one of the plurality of second bit lines and the second read current source;
a sensing circuit to which the first and second read transistors are connected in parallel; and
a third read transistor having a first end connected to the first and second source lines, and a second end that is grounded.

15. The STT-MRAM of claim 9, further comprising:
at least one decoder disposed at least one of between the memory cell area and the control circuit, and between the reference cell area and the control circuit.

16. The STT-MRAM of claim 9, further comprising:
first and second memory cell areas including a plurality of the memory cells; and
first and second reference cell areas including a plurality of the reference cells; wherein
the first memory cell area and the first reference cell area constitute a first cell block,
the second memory cell area and the second reference cell area constitute a second cell block, and
the control circuit is disposed between the first and second cell blocks.

17. The STT-MRAM of claim 16, wherein the control circuit comprises:
at least one read circuit configured to read data of the second memory cell area using the first reference cell area, and read data of the first memory cell area using the second reference cell area.

18. The STT-MRAM of claim 16, wherein the first cell block includes, a plurality of first word lines,
a plurality of first bit lines that intersect the plurality of first word lines, and
a first source line disposed between neighboring ones of the plurality of first word lines, and wherein the second cell block includes,
a plurality of second word lines,
a plurality of second bit lines that intersect the plurality of second word lines, and
a second source line disposed between neighboring ones of the plurality of second word lines.

19. The STT-MRAM of claim 18, wherein the control circuit comprises:
at least one read circuit including,
a sensing circuit,
first and second read wires connected to the sensing circuit in parallel, and connected to bit lines of the first and second cell blocks, respectively,
a first memory cell-reading current source and a first reference cell-reading current source that are connected to the first read wire in parallel,
a second reference cell-reading current source and a second memory cell-reading current source that are connected to the second read wire in parallel,
a first read transistor disposed between the first read wire and the first memory cell-reading current source, and between the second read wire and the second reference cell-reading current source,
a second read transistor disposed between the first read wire and the first reference cell-reading current source, and between the second read wire and the second memory cell-reading current source, and
a third read transistor having a first end connected to the first and second source lines, and a second end that is grounded.

20. The STT-MRAM of claim 18, wherein the control circuit comprises:
at least one write circuit including,
first and second write transistors connected to the write current source in parallel,
a third write transistor connected to the second write transistor, and
a fourth write transistor connected to the first write transistor, wherein
the first and fourth write transistors are connected to one of the plurality of first bit lines and one of the plurality of second bit lines,
the second and third write transistors are connected to the first and second source lines, and
the third and fourth write transistors are grounded.

21. The STT-MRAM of claim 20, further comprising:
a first selection transistor connected between one the plurality of first bit lines and the write circuit; and
a second selection transistor connected between one of the plurality of second bit lines and the write circuit.

22. The STT-MRAM of claim 16, further comprising:
at least one decoder disposed between at least one of the first cell block and the control circuit, and between the second cell block and the control circuit.

23. A method of operating a spin transfer torque magnetic random access memory (STT-MRAM), the STT-MRAM including at least one memory cell including a first magnetic tunneling junction (MTJ) element and a first transistor connected to the first MTJ element, at least one reference cell including second and third MTJ elements connected in parallel, and second and third transistors that are connected to the second and third MTJ elements, respectively, wherein the reference cell is configured to operate as a reference during a read operation, and wherein the STT-MRAM further includes a control circuit configured to supply opposite write currents to the second and third MTJ elements, respectively, the method comprising:
supplying a first write current to the second MTJ element;
supplying a second write current to the third MTJ element, wherein a direction of the second write current is opposite to a direction of the first write current;
supplying a third write current to the memory cell; and
supplying first and second read currents to the memory cell and the reference cell respectively, wherein a magnitude of the second read current is greater than that of the first read current.

24. The method of claim 23, wherein the control circuit comprises:
a write circuit including,
a write current source,
first and second write transistors connected to the write current source in parallel,
a third write transistor connected to the second write transistor,
a fourth write transistor connected to the first write transistor,
a first selection transistor connected between an end of the first MTJ element and the first and fourth write transistors, and
a second selection transistor connected between ends of the second and third MTJ elements and the first and fourth write transistors, wherein
the second and third write transistors are connected to ends of the first through third transistors, and
the third and fourth write transistors are grounded.

25. The method of claim 24, wherein the supplying of the first write current to the second MTJ element comprises:
turning-on the first and third write transistors, the second selection transistor, and the second transistor.

26. The method of claim 24, wherein the supplying of the second write current to the third MTJ element comprises:
turning-on the second and fourth write transistors, the second selection transistor, and the third transistor.

27. The method of claim 24, wherein the supplying of the third write current to the first MTJ element comprises one of:
turning-on the first and third write transistors, the first selection transistor, and the first transistor; and
turning-on the second and fourth write transistors, the first selection transistor, and the first transistor.

28. The method of claim 23, wherein the control circuit comprises:
a read circuit including,
a first read current source connected to the memory cell,
a first read transistor connected between the memory cell and the first read current source,
a second read current source connected to the reference cell,
a second read transistor connected between the reference cell and the second read current source,
a sensing circuit to which the first and second read transistors are connected in parallel, and
a third read transistor having a first end connected to the first through third transistors, and a second end that is grounded.

29. The method of claim 28, wherein the supplying of the first and second read currents comprises:
turning-on the first through third read transistors, and the first through third transistors.

30. The method of claim 23, wherein the STT-MRAM comprises:
first and second memory cell areas including a plurality of the memory cells;
first and second reference cell areas including a plurality of the reference cells; wherein
the first memory cell area and the first reference cell area constitute a first cell block,
the second memory cell area and the second reference cell area constitute a second cell block, and
the control circuit is disposed between the first and second cell blocks.

31. The method of claim 30, further comprising:
supplying the first read current to a memory cell of the first memory cell area, and simultaneously supplying the second read current to a reference cell of the first reference cell area; and
supplying the first read current to a memory cell of the second memory cell area and simultaneously supplying the second read current to a reference cell of the second reference cell area.

* * * * *